United States Patent
Tanio

(10) Patent No.: US 9,270,241 B2
(45) Date of Patent: Feb. 23, 2016

(54) POWER SUPPLY DEVICE, TRANSMISSION DEVICE USING SAME, AND METHOD FOR OPERATING POWER SUPPLY DEVICE

(75) Inventor: Masaaki Tanio, Tokyo (JP)

(73) Assignee: NEC Corporation, Tokyo (JP)

( * ) Notice: Subject to any disclaimer, the term of this patent is extended or adjusted under 35 U.S.C. 154(b) by 124 days.

(21) Appl. No.: 14/117,287

(22) PCT Filed: Apr. 25, 2012

(86) PCT No.: PCT/JP2012/061077
§ 371 (c)(1),
(2), (4) Date: Nov. 12, 2013

(87) PCT Pub. No.: WO2012/157418
PCT Pub. Date: Nov. 22, 2012

(65) Prior Publication Data
US 2015/0137886 A1    May 21, 2015

(30) Foreign Application Priority Data

May 13, 2011   (JP) .................................. 2011-108176

(51) Int. Cl.
| | |
|---|---|
| *H03F 3/04* | (2006.01) |
| *H03F 3/21* | (2006.01) |
| *H03F 1/02* | (2006.01) |
| *H03F 3/189* | (2006.01) |
| *H03F 3/24* | (2006.01) |
| *H03F 3/217* | (2006.01) |

(52) U.S. Cl.
CPC .............. *H03F 3/211* (2013.01); *H03F 1/0222* (2013.01); *H03F 3/189* (2013.01); *H03F 3/2171* (2013.01); *H03F 3/2173* (2013.01); *H03F 3/245* (2013.01); *H03F 2200/432* (2013.01); *H03F 2200/541* (2013.01); *H03F 2203/21161* (2013.01); *H03F 2203/21193* (2013.01)

(58) Field of Classification Search
USPC .................................................. 330/127, 297
IPC .......................................................... H03F 3/04
See application file for complete search history.

(56) References Cited

U.S. PATENT DOCUMENTS

| | | |
|---|---|---|
| 5,990,751 A | 11/1999 | Takita |
| 6,084,468 A | 7/2000 | Sigmon et al. |

(Continued)

FOREIGN PATENT DOCUMENTS

| | | |
|---|---|---|
| CN | 101867284 A | 10/2010 |
| CN | 102265504 | 11/2011 |

(Continued)

OTHER PUBLICATIONS

Wang, Feipeng et al., "Envelope Tracking Power Amplifier with Pre-Distortion Linearization for WLAN 802.11g", 2004 IEEE MTT-S Digest, vol. 3, p. 1543-1546.

(Continued)

*Primary Examiner* — Patricia T Nguyen
(74) *Attorney, Agent, or Firm* — Wilmer Cutler Pickering Hale and Dorr LLP

(57) ABSTRACT

A power supply device includes a switching amplification unit that supplies power to a load, a linear amplification unit that corrects an output voltage applied to the load according to an input signal, and a power supply control unit that controls the power supply of the linear amplification unit according to the input signal.

4 Claims, 16 Drawing Sheets

(56) References Cited

U.S. PATENT DOCUMENTS

| | | | |
|---|---|---|---|
| 6,175,273 B1 | 1/2001 | Sigmon et al. | |
| 7,058,373 B2 * | 6/2006 | Grigore | 455/127.1 |
| 8,698,558 B2 * | 4/2014 | Mathe et al. | 330/251 |
| 8,803,605 B2 * | 8/2014 | Fowers et al. | 330/136 |
| 8,902,001 B2 * | 12/2014 | Kunihiro et al. | 330/127 |
| 2009/0191826 A1 | 7/2009 | Takinami et al. | |
| 2009/0289720 A1 * | 11/2009 | Takinami et al. | 330/297 |
| 2010/0244951 A1 * | 9/2010 | Smith | 330/127 |
| 2012/0019319 A1 * | 1/2012 | Drogi et al. | 330/127 |

FOREIGN PATENT DOCUMENTS

| | | |
|---|---|---|
| DE | 19882705 T1 | 9/2000 |
| DE | 19882705 C2 | 6/2003 |
| EP | 2378657 | 10/2011 |
| EP | 2579456 A1 | 4/2013 |
| GB | 2465146 A | 5/2010 |
| JP | 58-121803 | 7/1983 |
| JP | 04-271506 A | 9/1992 |
| JP | 2001-519612 | 10/2001 |
| JP | 2003-533116 | 11/2003 |
| JP | 2005-286995 | 10/2005 |
| JP | 2007-215158 | 8/2007 |
| JP | 2010-154645 A | 7/2010 |
| JP | 2010-219944 | 9/2010 |
| SE | 522517 | 2/2004 |
| WO | WO-99/18663 | 4/1999 |
| WO | WO-2005/011109 | 2/2005 |
| WO | WO-2010/073942 | 7/2010 |

OTHER PUBLICATIONS

Yundt, George B., "Series- or Parallel-Connected Composite Amplifiers", IEEE Transaction on Power Electronics, vol. PE-1, No. 1, 1986, p. 48-54.

International Search Report corresponding to PCT/JP2012/061077, dated Jul. 2, 2012, 5 pages.

Extended European Search Report issued by the European Patent Office for European Patent Application No. 12786254.8 dated Nov. 13, 2014 (7 pgs.).

Japanese Office Action corresponding to Japanese Application No. 2013-515067, dated Nov. 10, 2015, 6 pages.

* cited by examiner

POWER SUPPLY DEVICE, TRANSMISSION DEVICE USING SAME, AND METHOD FOR OPERATING POWER SUPPLY DEVICE

CROSS-REFERENCE TO RELATED APPLICATIONS

This application is a national stage application of International Application No. PCT/JP2012/061077 entitled "Power Supply Device, Transmission Device Using Same, and Method for Operating Power Supply Device," filed on Apr. 25, 2012, which claims the benefit of the priority of Japanese patent application No. 2011-108176, filed on May 13, 2011, the disclosures of each of which are hereby incorporated by reference in their entirety.

TECHNICAL FIELD

The present invention relates to a power supply device, a transmission device using the same, and a method for operating the power supply device, and more particularly to a power supply device that combines a switching amplifier with a linear amplifier, a transmission device using the same, and a method for operating the power supply device.

BACKGROUND ART

In a digital modulation method used for recent wireless communication such as a mobile phone or a wireless LAN (Local Area Network), a modulation format of QPSK (Quadrature Phase Shift Keying) or multivalued QAM (Quadrature Amplitude Modulation) is employed.

In such a modulation format, generally, the locus of a signal is accompanied by amplitude modulation during a change between systems. This causes, in the case of a high-frequency modulation signal that is superimposed on a carrier signal of a microwave band, a change in amplitude (envelope) of the signal over time. In this case, the ratio of peak power to average power of the high-frequency modulation signal is referred to as PAPR (Peak-to-Average Power Ratio).

When a signal having large PAPR is amplified, to secure high linearity, sufficiently large power must be supplied from a power source to an amplifier so as to prevent a waveform from being distorted with respect to the peak power. In other words, the amplifier must be operated with a margin (back-off) in a region of power sufficiently lower than saturated power limited by a power supply voltage. Generally, in a linear amplifier operated with a grade A or a grade B, power efficiency is highest near its saturated output power. Thus, when the amplifier is operated in a large back-off region, average efficiency is lower.

In an OFDM (Orthogonal Frequency Division Multiplexing) method using a multicarrier employed in a next-generation mobile phone, wireless LAN, or digital television broadcasting, PAPR tends to be very large, and the average efficiency of the amplifier is much lower. Thus, as characteristics of the amplifier, desirably, high efficiency is provided even in the large back-off power region.

As a method for amplifying a signal to high efficiency over a wide dynamic range in the large back-off power region, there is known a transmission method such as Envelope Elimination and Restoration (EER) or Envelope Tracking (ET).

In the EER method, first, an input modulation signal is decomposed into its phase component and its amplitude component. The phase component is input to a power amplifier at constant amplitude while phase modulation information is maintained. In this case, the power amplifier is always operated near saturation where efficiency is highest. On the other hand, in the case of the amplitude component, the output voltage of the power supply device is changed according to amplitude modulation information, and this is used as power for the amplifier.

Thus operated, the power amplifier operates as a multiplier, the phase component and the amplitude component of the modulation signal are synthesized, and an output modulation signal amplified with high efficiency irrespective of back-off is obtained.

In the ET method, a configuration in which the amplitude component of the input modulation signal changes the output voltage of the power supply device according to amplitude modulation information, and this is used as power for the amplifier is similar to that of the EER method. A difference is that while in the EER method, the amplifier is operated in the saturated manner by inputting only the phase modulation signal of constant amplitude to the amplifier, in the ET method, the amplifier is operated in the linear manner by directly inputting the input modulation signal including both amplitude modulation and phase modulation to the amplifier.

In this case, efficiency is lower than that in the EER method because of the linear operation of the amplifier. However, since only minimum necessary power is supplied to the amplifier according to the size of the amplitude of the input modulation signal, higher power efficiency can still be obtained compared with a case where the amplifier is used at a constant voltage irrespective of amplitude. In the ET method, a timing margin for synthesizing the amplitude component and the phase component is weakened, thus providing an advantage of easier realization than the EER method.

The modulation power supply device used in the EER method or the ET method must be a voltage source that can accurately and highly efficiently change the output voltage with low noise according to the amplitude component of the input modulation signal. It is because in the recent wireless communication method such as a mobile phone using digital modulation, ACPR (Adjacent Channel Leakage Power Ratio) or EVM (Error Vector magnitude) representing a modulation error must be reduced to a fixed value or lower to meet the standard.

When the output voltage of the power supply device is not linear with respect to the input amplitude signal, ACPR or EVM deteriorates due to mutual modulation distortion. When the noise of the power supply enters into the output of the amplifier, ACPR also deteriorates.

It is said that in the EER method or the ET method, the response band (speed) of the power supply device must be at least twice as large as or more than that (speed) of the modulation signal. For example, according to the WCDMA (Wideband Code Division Multiple Access) standard of the mobile phone, a modulation band is about 5 MHz. According to the IEEE 801.11 a/g standard of the wireless LAN, a modulation band is about 20 MHz. In the general power supply device of a switching converter configuration, it is difficult to output the modulation signal of such a wide band.

Related to the foregoing, Nonpatent Literature 1 (upper stage of FIG. 2) discloses, to achieve a highly efficient and high-quality voltage source, two basic configurations of hybrid voltage sources that combine highly efficient switching amplifiers with highly accurate linear amplifiers.

FIG. 1 is a diagram showing, as one of the two hybrid voltage sources disclosed in Nonpatent Literature 1, the configuration of a power supply device having a voltage modulation function according to a first related technology. In the drawing, A1 is an equivalent circuit.

In the power supply device shown in FIG. 1, switching amplifier 2 operating as a current source and linear amplifier 3 operating as a voltage source are connected in parallel. With this configuration, highly accurate linear amplifier 3 plays the role of correcting output voltage Vout to be equal to reference signal Vref. On the other hand, switching amplifier 2 detects output current Ic from linear amplifier 3. Then, based on the result, control signal generation unit 4 controls switching elements 21 and 22.

Through such an operation, switching amplifier 2 operates as a current source, and the most part of power supplied to load 1 is supplied from highly efficient switching amplifier 2. Accordingly, since linear amplifier 3 that is high in accuracy but low in efficiency consumes only power necessary for eliminating ripples included in output voltage Vout, a voltage source that is high in both accuracy and efficiency can be achieved.

FIG. 2 is a diagram showing, as the other of the two hybrid voltage sources disclosed in Nonpatent Literature 1, the configuration of a power supply device having a voltage modulation function according to a second related technology. In the drawing, A2 is an equivalent circuit.

In the power supply device shown in FIG. 2, switching amplifier 2 and linear amplifier 3 are connected in series. With this configuration, highly accurate linear amplifier 3 plays the role of applying feedback to and correcting output voltage Vout to be equal to reference signal Vref. On the other hand, switching amplifier 2 applies feedback to output voltage Vm to be almost equal to reference voltage Vref (or output voltage Vout obtained by linearly scaling the same), and control signal generation unit 4 controls switching elements 21 and 22.

Output voltage Vc of linear amplifier 3 is added to this in series, for example, by transformer 35. Through such an operation, the most power that is supplied to load 1 is supplied from highly efficient switching amplifier 2. Accordingly, since linear amplifier 3 that is high in accuracy but low in efficiency consumes only power necessary for eliminating ripples included in the output voltage, a voltage source that is high in both accuracy and efficiency can be achieved.

The configuration of the hybrid voltage source combining the switching amplifier with the linear amplifier is classified into one of those shown in FIGS. 1 and 2.

Nonpatent Literature 2 (FIG. 6) discloses an amplifier where the configuration of the hybrid voltage source shown in FIG. 1 is applied to the power supply device of the ET method.

FIG. 3 is a block diagram showing the configuration of a transmission device that uses the power supply device shown in FIG. 1.

In the transmission device shown in FIG. 3, amplitude component 9 of the input modulation signal is input to a portion equivalent to reference voltage Vref shown in FIG. 1, and highly efficient and wide-band modulation voltage 11 that is obtained is supplied as power for power amplifier 1. Hereinafter, the specific operation of the transmission device shown in FIG. 3 will be described by using an operating waveform.

FIGS. 4a to 4c are diagrams each showing the operating waveform of the power supply device shown in FIG. 1.

First, amplitude signal 9 is input to linear amplifier 3 of a voltage follower including operational amplifier 31. In this case, as input amplitude signal 9, the envelope of a WCDMA downlink signal is used (refer to waveform 9 shown in FIG. 4a).

Then, output current (operational amplifier current) Ic of linear amplifier 3 is converted into a voltage at current detection resistor 7 to be input to hysteresis comparator 51 of control signal generation unit 4. In this case, hysteresis comparator 51 selects signal polarities to be High when current flows out from linear amplifier 3 (Ic>0) and Low when current flows in (Ic<0). Accordingly, a pulse width modulation signal is output according to the intensity of input amplitude signal 9. This pulse width modulation signal is used as the control signal of switching element 21 typically including MOSFET (Metal Oxide Semiconductor Field Effect Transistor).

Switching element 21 constitutes a switching converter with diode 22. When control signal 50 from hysteresis comparator 51 is High, switching element 21 is turned ON (conductive state), and current flows from power source Vcc 1 to load 1. In this case, switching voltage Vsw is set to Vcc 1 (set to 15 V) (refer to waveform 10 shown in FIG. 4c). The current from switching element 21 is passed through inductor 23 (set to 0.6 uH) to be integrated, thus becoming switching current Im where a switching frequency component has been eliminated.

At output terminal Vout, Ic=Iout−Im is established. Thus, when switching current Im of switching amplifier 2 is excessive with respect to output current Iout flowing from output terminal Vout to power amplifier 1, operational amplifier current Ic of linear amplifier 3 reversely flows (Ic<0), and starts to flow in a direction into operational amplifier 3.

As a result, the polarity of control signal 50 of hysteresis comparator 51 is reversed from High to Low, and switching element 21 is turned from ON to OFF (nonconductive state). At this time, to maintain the current flowing through inductor 23, current Im flows from ground (GND) to load (power amplifier) 1 via diode 22. Cathode potential Vsw of diode 22 is set to 0 V (refer to waveform 10 shown in FIG. 4c).

By repeating the aforementioned switching operation, switching current Im is supplied to load 1 alternately from Vcc 1 and GND (refer to waveform 13 shown in FIG. 4b).

Switching current Im 13 includes an error component generated by switching. However, a voltage is corrected by linear amplifier 3, and output signal 11 (refer to waveform 11 shown in FIG. 4c) is supplied to amplifier 1 by accurately reproducing and amplifying the waveform of input signal 9.

In the series of operations, the current (refer to waveform 14 shown in FIG. 4b) flowing through operational amplifier 31 that is low in efficiency is only an error component, and thus the power consumption of linear amplifier 3 is reduced. Since the most the input signal is amplified by highly efficient switching unit 2, the efficiency of the power supply device can be increased.

By performing the aforementioned EER or ET operation using output voltage Vout thus obtained as power for power amplifier 1, only minimum necessary power is supplied from the power supply device according to the amplitude of the input modulation signal. As a result, power amplifier 1 can always operate near saturation of high efficiency, and the power efficiency of the entire transmitter system including the power supply device and the power amplifier can be increased.

Related to the foregoing, Patent Literature 1 discloses an amplification circuit for amplifying an input signal, including a voltage source that operates with a first bandwidth and first power efficiency and generates a first signal having a voltage changed with the input signal, a current source that operates with a second bandwidth not wider than the first bandwidth and second power efficiency that is higher than the first power efficiency and generates a second signal having current changed with current in the first signal, and a load which is coupled in parallel between the voltage source and the current source and to which the first and second signals are applied.

Patent Literature 2 discloses an amplification device for amplifying the amplitude component of an input signal including the amplitude component and a phase component to synthesize it with the phase component, thereby generating an output signal obtained by amplifying the input signal, including a pulse modulation unit that generates a pulse modulation signal by subjecting the amplitude component of the input signal to pulse modulation to amplify it, a low-pass filter that generates an amplified amplitude signal by filtering the pulse modulation signal from the pulse modulation unit to amplify the amplitude component, an error correction unit that generates a corrected amplitude signal by correcting an error included in the amplified amplitude signal from the low-pass filter by using the amplitude component of the input signal, and a synthesis unit that generates an output signal by synthesizing the corrected amplitude signal from the error correction unit with the phase component of the input signal.

CITATION LIST

Patent Literature 1: JP2003-533116A
Patent Literature 2: JP2007-1215158A
Nonpatent Literature 1: pp. 48-54, "Series- or Parallel-Connected Composite Amplifiers", by George B. Yundt, IEEE TRANSACTIONS ON POWER ELECTRONICS, Vol.PE-1, No. 1, January 1986
Nonpatent Literature 2: pp. 1543-1546, "Envelope Tracking Power Amplifier withPre-Distortion Linearization for WLAN 802.11g", by Feipeng Wang et al., 2004 IEEE MTT-S Digest, Vol. 3

SUMMARY OF INVENTION

Problems to be Solved

In the transmission device shown in FIG. 3, to achieve high efficiency, desirably, the switching frequency of switching element 21 is set higher than the modulation band of input signal 9 as much as possible, and the current flowing through operational amplifier 31 is reduced by reducing a switching error included in switching current Im.

However, when this circuit configuration is applied to a device that consumes a large amount of power such as a mobile phone base station, power supply voltage Vcc 1 is set to several tens V, and it is generally difficult to switch such a large amplitude signal with small losses at a high speed.

Because output parasitic capacity Cp is present in MOSFET 21 or diode 22 included in the switching amplifier, a power loss of $Cp \times V^2 \times fsw$ is generated when this is switched by power supply voltage V and switching frequency fsw, and the power loss is larger when power supply voltage V and switching frequency fsw increase, consequently reducing the efficiency of switching amplification unit 2.

Thus, to lower the switching efficiency, the value of output inductor 23 may be set to 2×L0 (=1.2 uH).

FIGS. 5a to 5c are diagrams each showing the other operating waveform of the power supply device shown in FIG. 1.

A switching frequency is reduced by about ½ from that L0 (=0.6 uH) shown in FIGS. 4A to 4C (refer to waveform 10 shown in FIG. 5c).

At a peak portion where the slew rate of the input signal (refer to waveform 9 shown in FIG. 5a) is large, the slew rate of the switching current (refer to waveform 13 shown in FIG. 5b) is lower than that of the input signal. As a result, at the peak portion, to reproduce the input signal waveform, large current (refer to waveform 14 shown in FIG. 5b) must be supplied from linear amplifier 3.

Conversely, at the portion of a small input signal, since the value of inductor 23 is large, even when switching is turned OFF, current Im 13 accompanying the last ON state remains. As a result, to reproduce the input signal waveform, a large current (refer to waveform 14 shown in FIG. 5b) must be recovered to linear amplifier 3.

Thus, when the signal of a wide band such as WCDMA is input, in reality, large current flows to linear amplifier 3 whose power efficiency is low, and consequently the efficiency of the entire power supply device is reduced. As a result, there is a problem of deterioration of efficiency of the entire transmitter that included the ET method power amplifier using the power supply device. This problem is similar in the devices disclosed in Patent Literatures 1 and 2.

It is therefore an object of the present invention to provide a highly efficient and highly linear power supply device with a function to change an output voltage according to the size of the input signal, a highly efficient transmission device using the same, and a method for operating the power supply device.

Solution to Problem

To achieve the object, according to a first aspect of the present invention, there is provided a power supply device including a switching amplification unit that supplies power to a load, a linear amplification unit that corrects an output voltage applied to the load according to an input signal, and a power supply control unit that controls the power supply of the linear amplification unit according to the input signal.

According to a second aspect of the present invention, there is provided a transmission device including the aforementioned power supply device, and a power amplifier that uses the power supply device as a power source.

According to a third aspect of the present invention, there is provided a method for operating a power supply device, including supplying power to a load by a switching amplification unit, correcting an output voltage applied to the load by a linear amplification unit according to an input signal, and controlling the power supply of the linear amplification unit by a power supply control unit according to the input signal.

Effects of Invention

According to the present invention, a highly efficient and highly linear power supply device having a function of changing an output voltage according to the size of an input signal, a highly efficient transmission device using the same, and a method for operating the power supply device can be provided.

DESCRIPTION OF EMBODIMENTS

The embodiments of a power supply device, a transmission device using the same, and a method for operating the power supply device according to the present invention will be described with reference to the drawings.

(First Embodiment)

Figure 6:
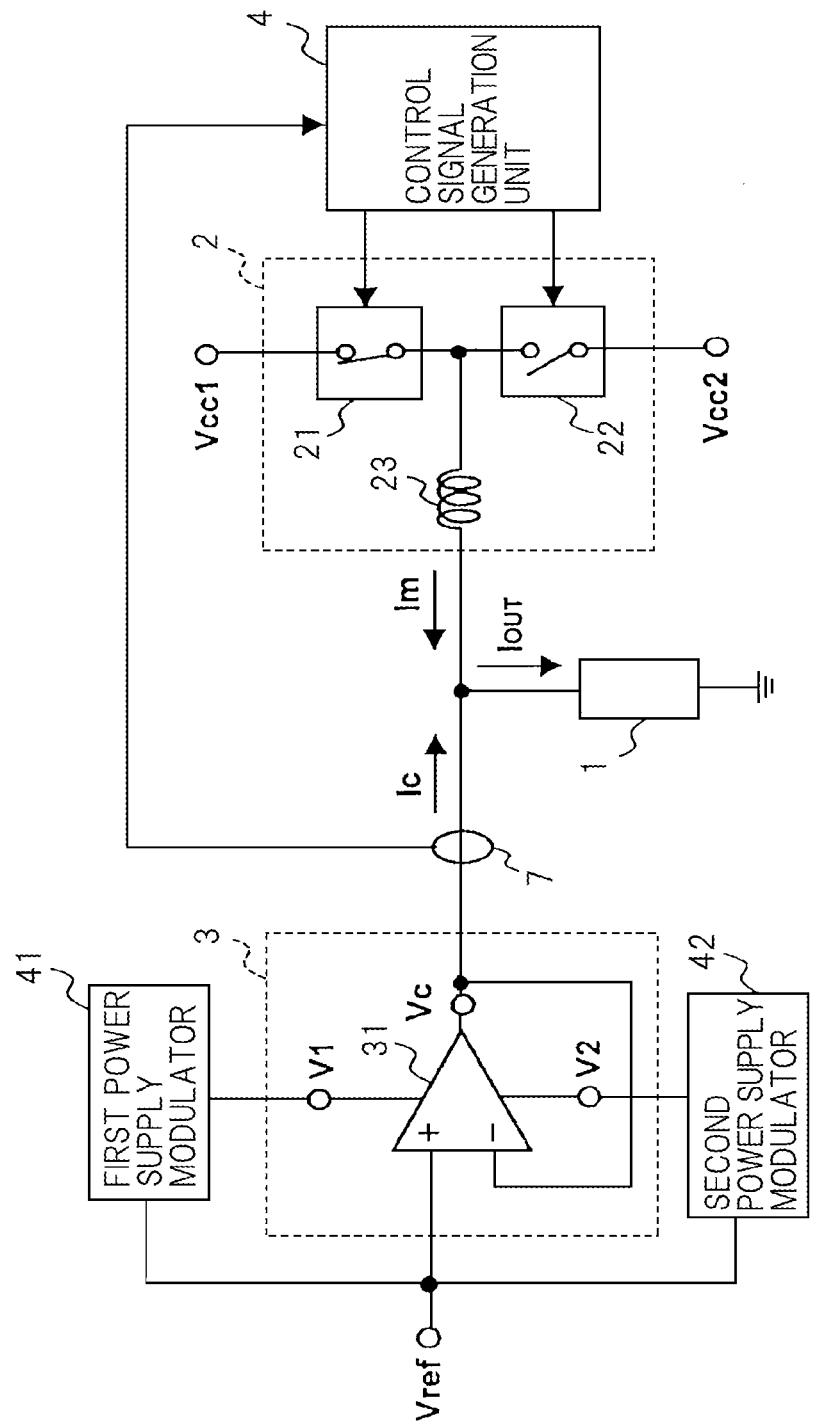
FIG. 6 A block diagram showing the configuration of a power supply device according to the first embodiment of the present invention.

FIG. 6 is a block diagram showing the configuration of a power supply device according to the first embodiment of the present invention.

The power supply device shown in FIG. 6 includes switching amplification unit 2 that supplies power to load 1 and operates as a current source, linear amplification unit 3 that operates as a voltage source for correcting an output voltage applied to load 1 to match an input voltage, and a power supply control unit that controls the power supply of linear amplification unit 3 according to an input signal. Switching amplification unit 2 and linear amplification unit 3 are connected to load 1 in parallel. The power supply of linear amplification unit 3 is modulated by the power supply control unit according to the input signal of linear amplification unit 3.

The power supply control unit includes first power supply modulator 41 that subjects a power supply of a positive side (positive power supply) of linear amplification unit 3 to voltage modulation according to input signal Vref, and second power supply modulator 42 that subjects a power supply of a negative side (negative power supply) of linear amplification unit 3 to voltage modulation according to input signal Vref.

In the case of a transmission device using the power supply device according to the embodiment, load 1 is a power amplifier.

The power supply device shown in FIG. 6 includes linear amplification unit 3 that includes operational amplifier 31 for linearly amplifying input signal Vref, current detection unit 7 that detects the flowing direction and the size of amplified current Ic, control signal generation unit 4 that generates and outputs a control signal having two values of High and Low based on the detected flowing direction and the detected size of the current, and switching amplification unit 2 that includes switching elements 21 and 22 operated ON (high level output) or OFF (low level output) based on the control signal.

With this configuration, output current Ic of linear amplification unit 3 and output current Im of switching amplification unit 2 are added together to be supplied to load 1. In this case, output current Ic of linear amplification unit 3 is supplied from first power supply modulator 41 that performs voltage modulation according to input signal Vref of linear amplification unit 3 when a value is positive, and is supplied to second power supply modulator 42 that performs voltage modulation according to input signal Vref when the value is negative.

At output terminal Vout of the power supply device shown in FIG. 6, the relationship of Ic=Tout−Im is established.

Figure 7:
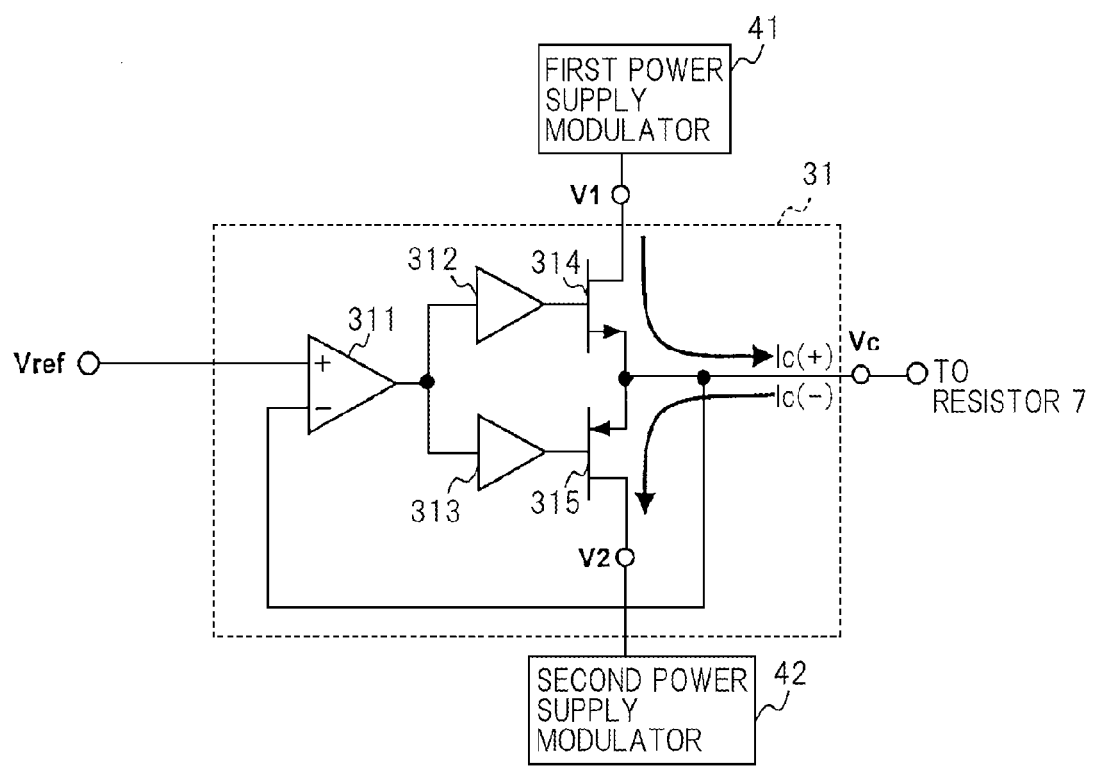
FIG. 7 A diagram showing the typical configuration of a linear amplification unit shown in FIG. 6.

FIG. 7 is a diagram showing the typical configuration of linear amplification unit 3 (operational amplifier 31) shown in FIG. 6.

Linear amplification unit 3 shown in FIG. 7 includes operational amplifier 311, buffer amplifiers 312 and 313, and n-type transistor 314 and p-type transistor 315 that constitute the source follower push-pull amplifier of an output stage.

With this configuration, when current Im from switching amplification unit 2 is short with respect to current Tout flowing through load 1, current Ic=Ic (+) flows out from first power supply modulator 41 via n-type transistor 314 that constitutes the output-stage push-pull amplifier of linear amplification unit 3, and flows as a part of current Tout into load 1. At this time, the loss generated at n-type transistor 314 is (V1−Vc)×Ic (+).

On the other hand, when current Im from switching amplification unit 2 is excessive with respect to current Tout flowing through load 1, current Ic=Ic (−) flows into second power supply modulator 42 via p-type transistor 315 that constitutes the output-stage push-pull amplifier of linear amplification unit 3. At this time, the power of (Vc−V2)×Ic (−) is consumed at p-type transistor 315.

Thus, according to the embodiment, power supply voltages V1 and V2 of the positive and negative sides of linear amplification unit 3 are respectively generated by first and second power supply modulators 41 and 42, and first and second power supply modulators 41 and 42 perform voltage modulation according to input signal Vref so that n-type transistor 314 and p-type transistor 315 can always operate in saturated regions. Accordingly, a power supply device can be provided, whose power loss and power consumption is smaller, as a whole, when compared with the case of the related technology where power supply voltages V1 and V2 of the positive and negative sides of linear amplification unit 3 are set to fixed biases.

In other words, as the effect of the embodiment, a power supply device capable of accurately following an input signal waveform and whose power loss is small with respect to the system can be provided. It is because the power supply device of the embodiment includes the switching amplification unit for highly efficiently supplying power to the load, and the highly accurate linear amplification unit for correcting the voltage applied to the load in order to linearly change according to the input signal waveform, and the linear amplification unit whose efficiency is low in the case of the related technology is enabled to perform highly efficient amplification by reducing power loss via the power supply modulator modulated according to the input signal.

(Second Embodiment)

Figure 8:
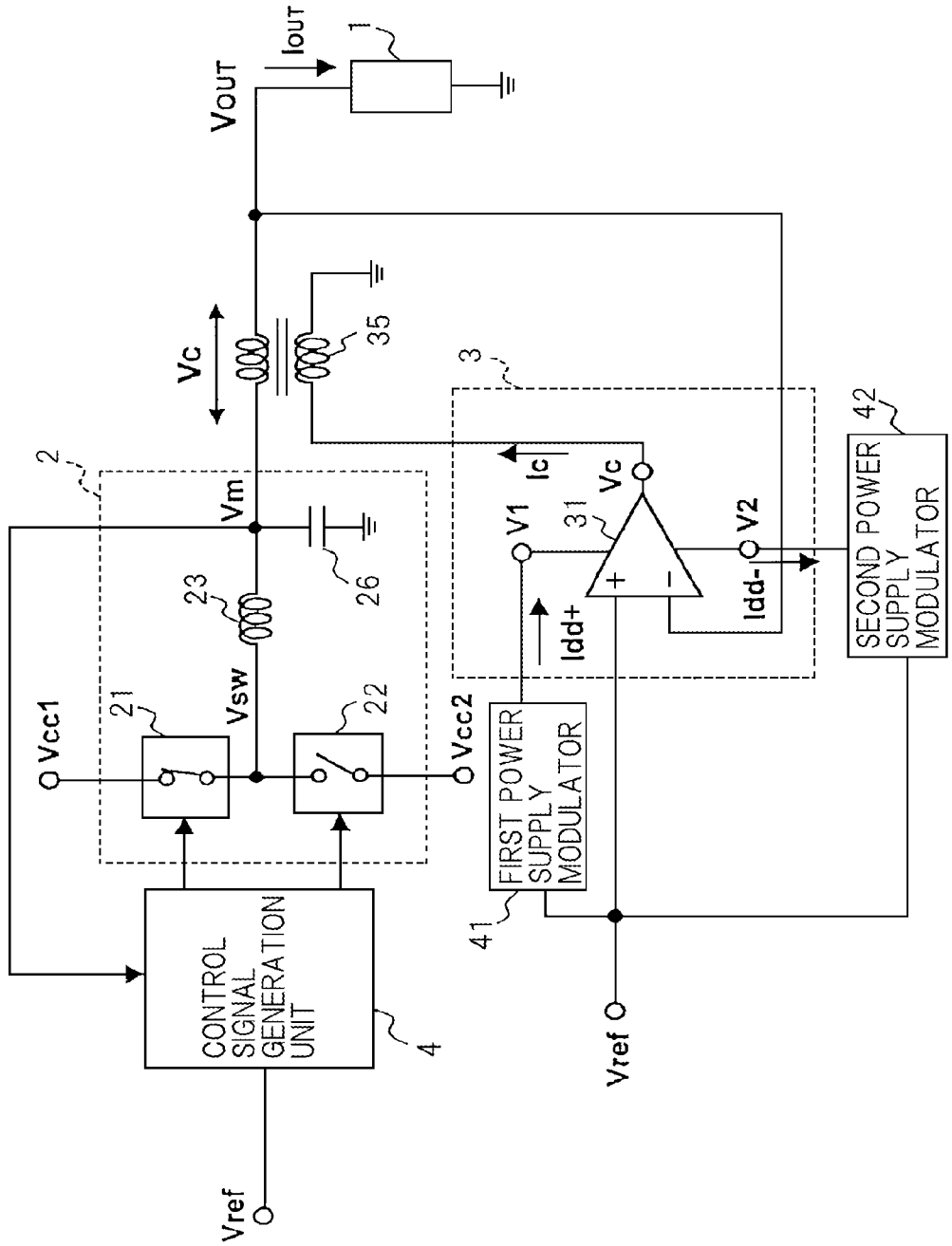
FIG. 8 A block diagram showing the configuration of a power supply device according to the second embodiment of the present invention.

FIG. 8 is a block diagram showing the configuration of a power supply device according to the second embodiment of the present invention.

The power supply device shown in FIG. 8 includes switching amplification unit 2 that supplies power to load 1 and operates as a voltage source, linear amplification unit 3 that operates as a voltage source for correcting an output voltage applied to load 1 to match an input voltage, and a power supply control unit that controls the power supply of linear amplification unit 3 according to an input signal. Switching amplification unit 2 and linear amplification unit 3 are connected to load 1 in series. The power supply of linear amplification unit 3 is modulated by the power supply control unit according to the input signal of linear amplification unit 3.

The power supply control unit includes first power supply modulator 41 that subjects a power supply of a positive side (positive power supply) of linear amplification unit 3 to voltage modulation according to input signal Vref, and second power supply modulator 42 that subjects a power supply of a negative side (negative power supply) of linear amplification unit 3 to voltage modulation according to input signal Vref.

In the case of a transmission device using the power supply device according to the embodiment, load 1 is the power amplifier.

More specifically, the power supply device shown in FIG. 8 includes linear amplification unit 3 that includes operational amplifier 31 for linearly amplifying input signal Vref, control signal generation unit 4 that generates and outputs a control signal having two values of High and Low so that output voltage Vm can approach output voltage Vout of the entire power supply device, and switching amplification unit 2 that includes switching elements 21 and 22 operated ON (high level output) or OFF (low level output) based on the control signal.

In this power supply device, output voltage Vm of linear amplification unit 3 and output voltage Vc of switching amplification unit 2 are added together to be supplied to load 1. In this case, output current Ic of linear amplification unit 3 is supplied from first power supply modulator 41 that performs voltage modulation according to input signal Vref of linear amplification unit 3 when a value is positive, and is supplied to second power supply modulator 42 that performs voltage modulation according to input signal Vref of linear amplification unit 3 when the value is negative.

At output terminal Vout of the power supply device shown in FIG. 8, the relationship of Vc=Vout−Vm is established.

Switching amplification unit 2 performs highly efficient switching amplification so that its output voltage Vm can approach output voltage Vout of the entire power supply device. Generally, Vout≠Vm is set.

Figure 9:
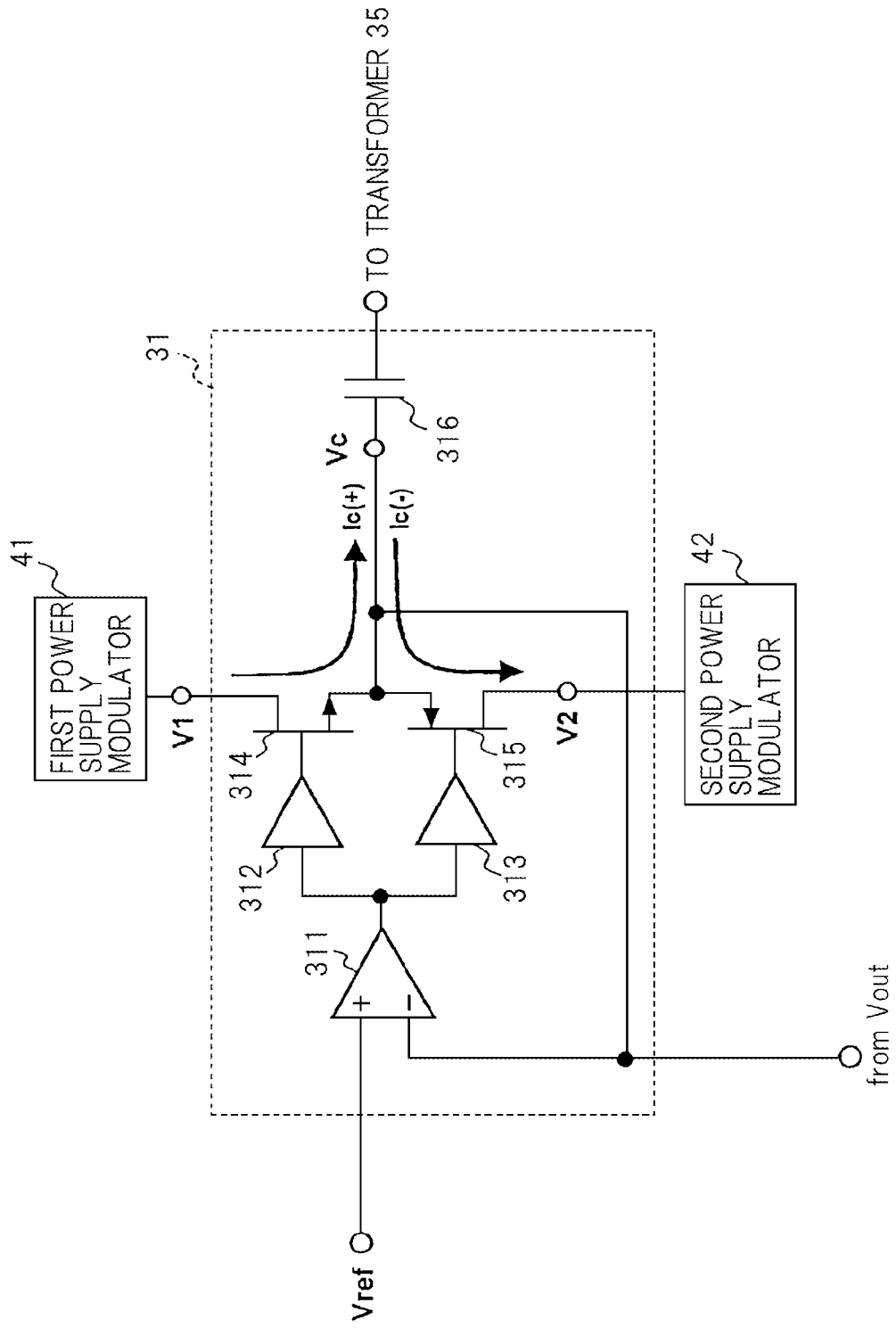
FIG. 9 A diagram showing the typical configuration of a linear amplification unit shown in FIG. 8.

FIG. 9 is a diagram showing the typical configuration of linear amplification unit 3 (operational amplifier 31) shown in FIG. 8.

Linear amplification unit 3 shown in FIG. 9 includes operational amplifier 311, buffer amplifiers 312 and 313, n-type transistor 314 and p-type transistor 315 that constitute the source follower push-pull amplifier of the output stage, and DC cutting capacity 316.

With this configuration, feedback is applied to linear amplification unit 3 so that output Vout and input voltage Vref of the power supply device can match each other (or are linearly scaled). Accordingly, when voltage Vm from switching amplification unit 2 is low with respect to voltage Vout applied to load 1 (Vm<Vout), current Ic=Ic (+) flows out from first power supply modulator 41 via n-type transistor 314 that constitutes the output-stage push-pull amplifier of linear amplification unit 3.

Accordingly, a voltage of Vc=Vout−Vm (>0) is generated on the primary side of transformer 35. Voltage Vc is transmitted to the secondary side of transformer 35, and added to voltage Vm from switching amplification unit 2 to generate desired output voltage Vout. In this case, a power loss generated at n-type transistor 314 is (V1−Vc)×Ic (+).

On the other hand, when voltage Vm from switching amplification unit 2 is higher than voltage Vout applied to load 1 (Vm>Vout), current Ic=Ic (−) flows into second power supply modulator 42 via p-type transistor 315 that constitutes the output-stage push-pull amplifier of linear amplification unit 3.

Accordingly, a power loss of Vc=Vout−Vm (<0) is generated on the primary side of transformer 35. Voltage Vc is transmitted to the secondary side of transformer 35, and added to voltage Vm from switching amplification unit 2 to generate desired output voltage Vout. In this case, power loss generated at p-type transistor 315 is (Vc−V2)×Ic (−).

Thus, according to the embodiment, power supply voltages V1 and V2 of the positive and negative sides of linear amplification unit 3 are respectively generated by first and second power supply modulators 41 and 42, and first and second power supply modulators 41 and 42 perform voltage modulation according to input signal Vref so that n-type transistor 314 and p-type transistor 315 can always operate in saturated regions. Accordingly, a power supply device can be provided, whose power loss and power consumption is smaller, as a whole, when compared with the case of the related technology where power supply voltages V1 and V2 of the positive and negative sides of linear amplification unit 3 are set to fixed biases.

In other words, as the effect of the embodiment, a power supply device capable of accurately following an input signal waveform and small in power losses with respect to the system can be provided. This is because the power supply device of the embodiment includes the switching amplification unit for highly efficiently supplying power to the load, and a highly accurate linear amplification unit for correcting the voltage applied to the load to linearly change according to the input signal waveform, and the linear amplification unit low in efficiency in the case of the related technology is enabled to perform highly efficient amplification by reducing power losses via the power supply modulator modulated according to the input signal.

EXAMPLE 1

Figure 10:
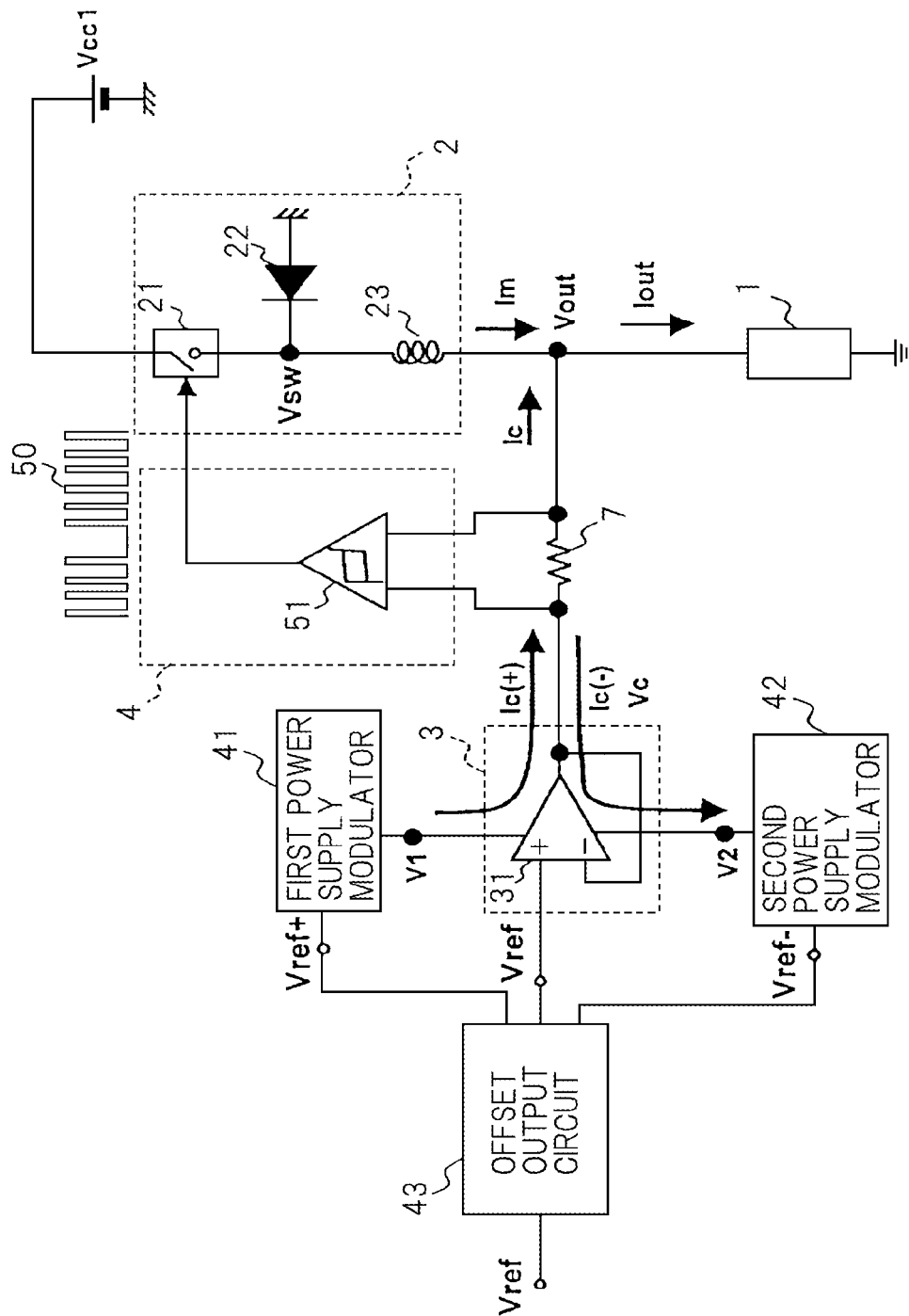
FIG. 10 A diagram showing a more specific First Example of each block of the power supply device shown in FIG. 6.

FIG. 10 shows the more specific First Example of each block of the power supply device shown in FIG. 6.

The power supply device shown in FIG. 10 includes, as in the case of that shown in FIG. 6, the constituting blocks of load 1, switching amplification unit 2, linear amplification unit 3, control signal generation unit 4, current detection unit 7, and first and second power supply modulators (power control units) 41 and 42.

Reference signal Vref to the power supply device is input to linear amplification unit 3 to be linearly amplified. Current detection unit 7 detects the flowing direction and the size of output current Ic of linear amplification unit 3, and inputs its result to control signal generation unit 4. Control signal generation unit 4 generates a pulse modulation signal of two values, i.e., High and Low, according to the detected flowing direction and the detected size of the current, and outputs it as a control signal to switching amplification unit 2. Switching amplification unit 2 operates ON or OFF switching elements 21 and 22 based on the control signal from control signal generation unit 4, and converts the signal into current Im at inductor 23 to output it. The output terminal of switching amplification unit 2 and the output terminal of linear amplification unit 3 are connected to each other, and both output currents Im and Ic are added together to be supplied to load 1. At this time, power supply voltages V1 and V2 of linear amplification unit 3 are respectively modulated by first and second power supply modulators 41 and 42. This voltage modulation is carried out based on reference signal Vref.

More specifically, the power supply device shown in FIG. 10 includes operational amplifier 31 that constitutes linear amplification unit 3, current detection resistor (hereinafter, referred to as resistor) 7 that constitutes the current detection unit, hysteresis comparator 51 that constitutes control signal generation unit 4, switching element 21, diode 22, and inductor 23 that constitutes switching amplification unit 2, and first and second power supply modulators 41 and 42 and offset output circuit 43 that constitutes the power control unit.

Next, the operation of the embodiment will be described in detail referring to FIG. 10.

As shown in FIG. 10, input signal Vref is input to operation amplifier 31 that constitutes a voltage follower at linear amplification unit 3. Output current Ic of operational amplifier 31 is converted into voltage by resistor 7 to be input to hysteresis comparator 51.

By selecting a polarity so that a value can be High when current flows out from operational amplifier 31 toward load 1 and Low when the current flows in, the output of comparator 51 becomes pulse width modulation signal 50 according to the intensity of input signal 9.

When output current Ic=Ic (+) flowing from linear amplification unit 3 toward load 1 increases to reach the threshold value of the high voltage side of hysteresis comparator 51, the output of hysteresis comparator 51 is set High. This signal is input to the gate of switching element 21 including, for example, MOSFET to turn ON (conductive state) switching element 21.

As a result, current flows in from power source Vcc 1 via switching element 21, is smoothed at inductor 23, and then current Im flows toward load 1. At this time, because of Vsw=Vcc 1, a reverse-direction voltage is applied to diode 22, and no current flows.

At output terminal Vout of the power supply device shown in FIG. 10, the relationship of Ic =Iout−Im is established.

Accordingly, when the supply of switching current Im is short with respect to output current Tout flowing through load 1, current Ic=Ic (+) from operational amplifier 31 is supplied from first power supply modulator 41. In this case, power loss generated at operational amplifier 31 is (V1−Vc)×Ic (+).

When the supply of current Im is excessive, operational amplifier current Ic=Ic (−) reversely flows into second power supply modulator 42 from operational amplifier 31. At this time, power loss generated at operational amplifier 31 is (Vc−V2)×Ic (−).

On the other hand, when voltage that is applied to resistor 7 by operational amplifier Ic (−) is smaller than the threshold value of the low voltage side of hysteresis comparator 51, the polarity of hysteresis comparator 51 is reversed, and switching element 21 is turned from ON to OFF (nonconductive state).

At this time, to maintain current flowing through inductor 23, current flows from ground (GND) toward load 1 via diode 22. Cathode potential Vsw of diode 22 is 0 V.

By repeating the aforementioned switching operation, switching element 21 and diode 22 alternately supply current Im to load 1.

Output voltage Vout of the power supply device is matched (or linearly scaled) with input signal Vref by linear amplification unit (voltage follower) 3.

Figure 1:
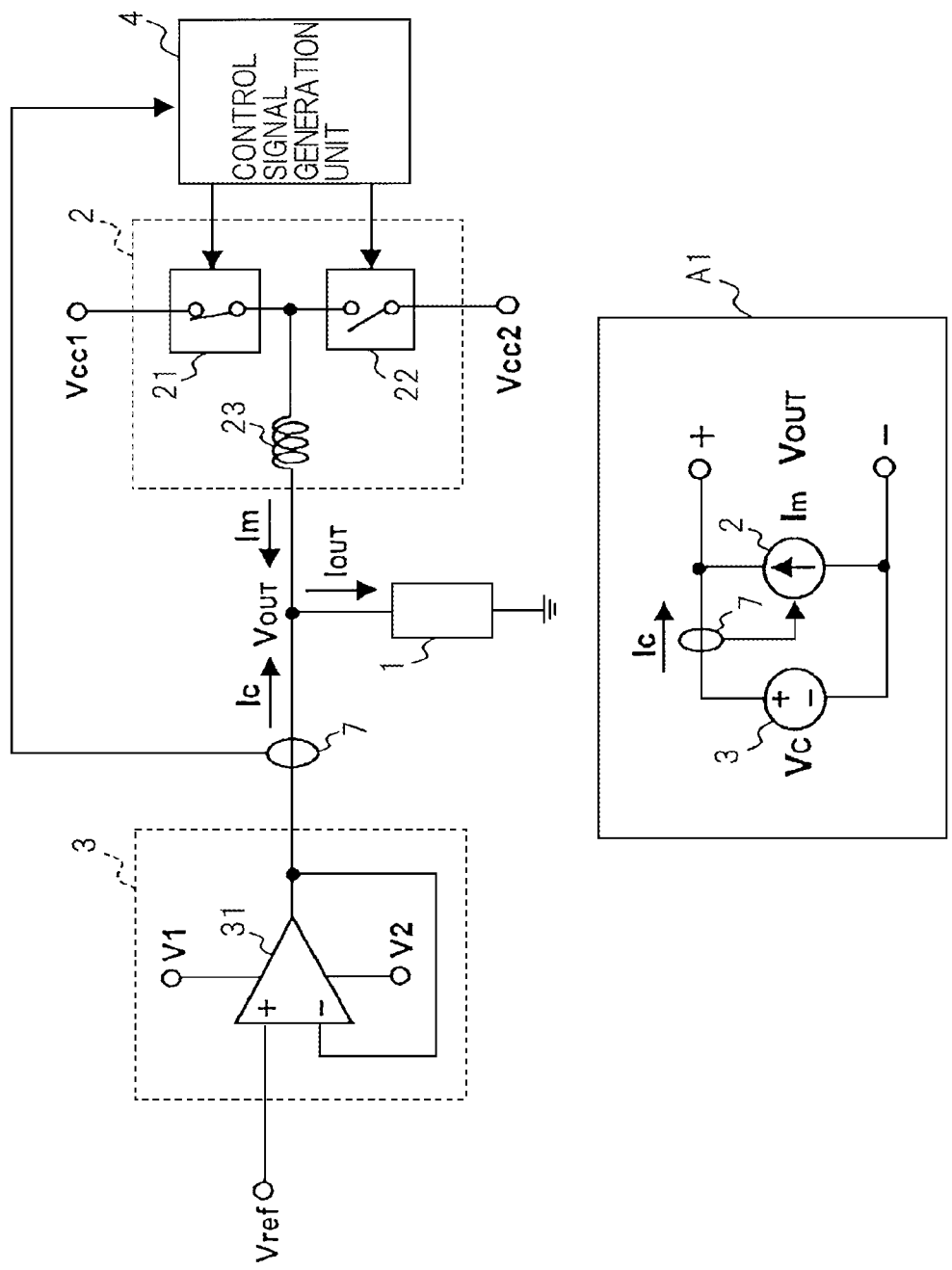
FIG. 1 A diagram showing the configuration of a power supply device having a voltage modulation function according to a first related technology as one of two hybrid voltage sources disclosed in Nonpatent Literature 1.
Figure 2:
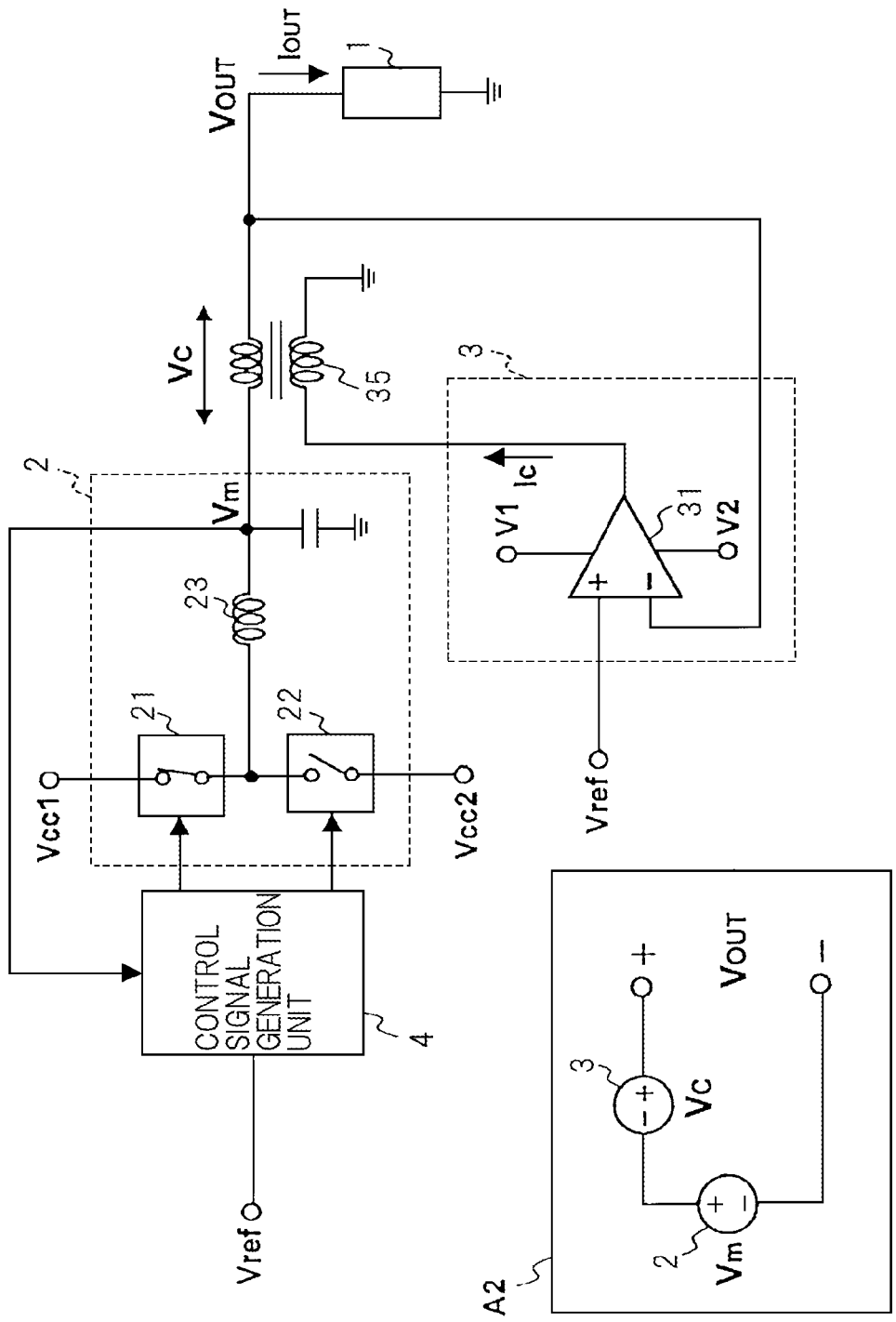
FIG. 2 A diagram showing the configuration of a power supply device having a voltage modulation function according to a second related technology as the other of the two hybrid voltage sources disclosed in Nonpatent Literature 1.
Figure 3:
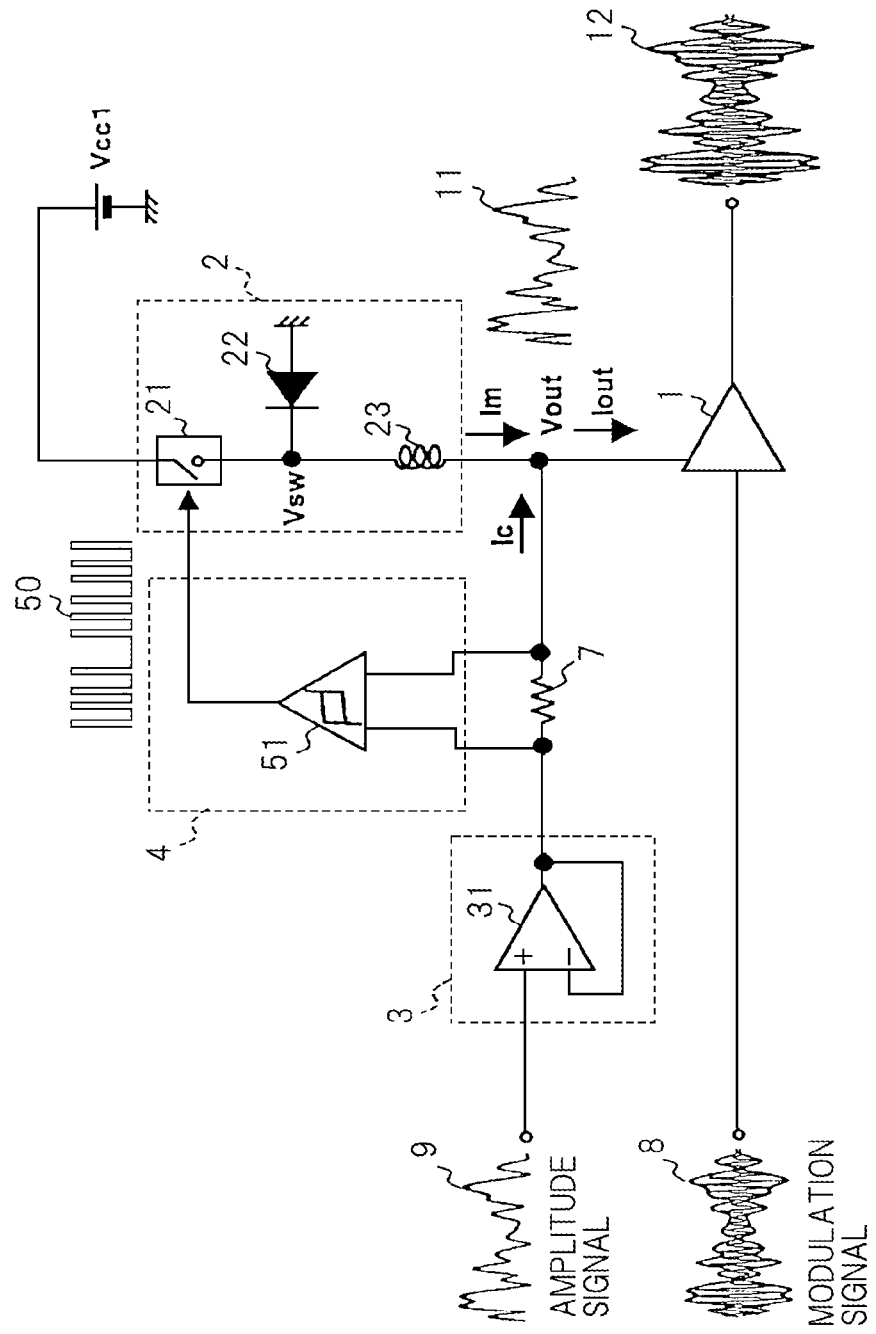
FIG. 3 A block diagram showing the configuration of a transmission device that uses the power supply device shown in FIG. 1.
Figure 4A:
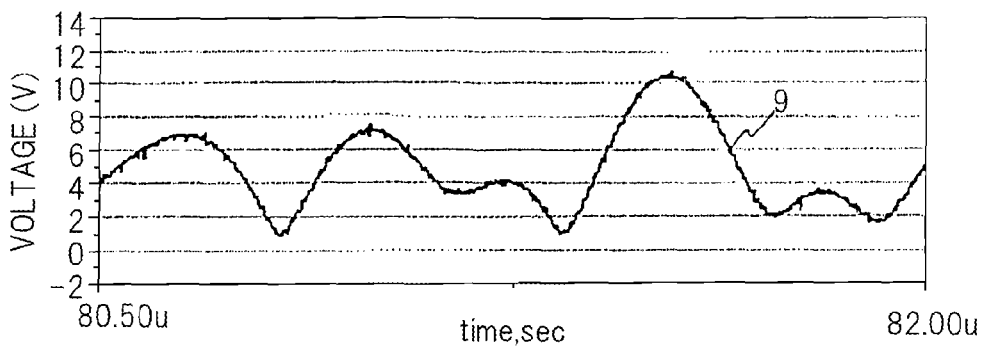
FIG. 4a A diagram showing the operating waveform of the power supply device shown in FIG. 1.
Figure 4B:
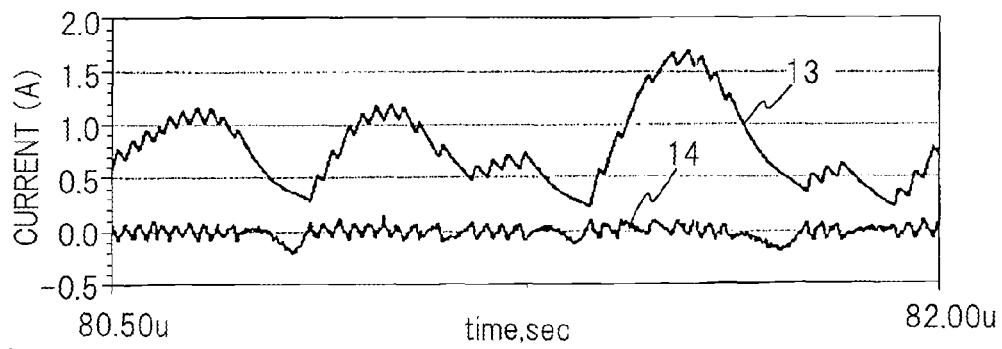
FIG. 4b A diagram showing the operating waveform of the power supply device shown in FIG. 1.
Figure 4C:
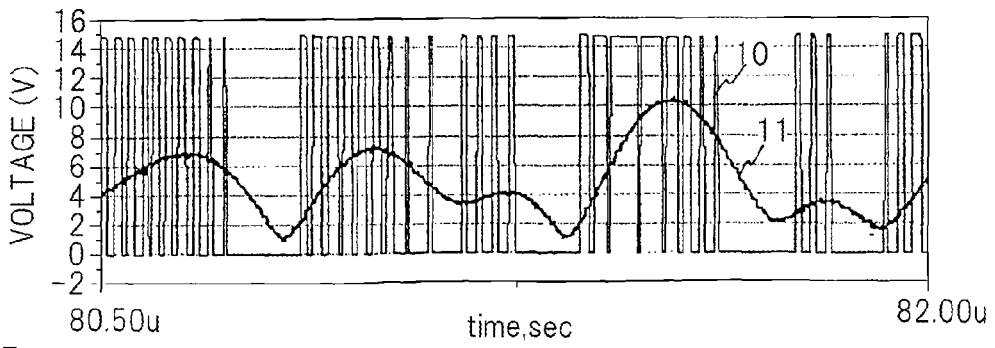
FIG. 4c A diagram showing the operating waveform of the power supply device shown in FIG. 1.
Figure 5A:
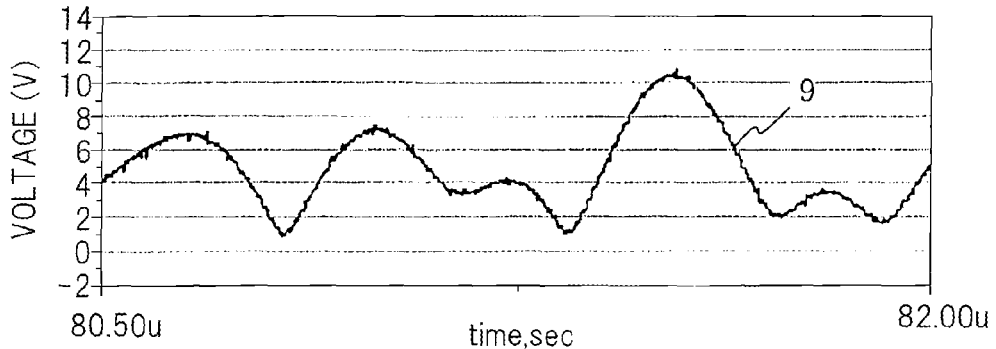
FIG. 5a A diagram showing the other operating waveform of the power supply device shown in FIG. 1.
Figure 5B:
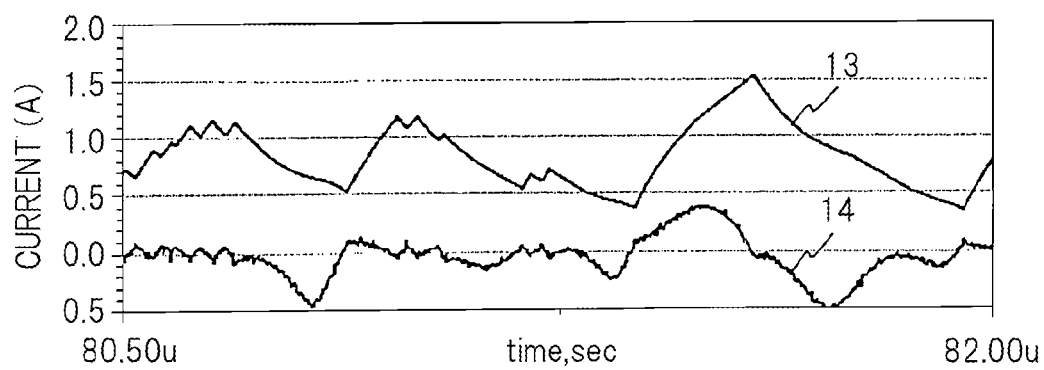
FIG. 5b A diagram showing the other operating waveform of the power supply device shown in FIG. 1.
Figure 5C:
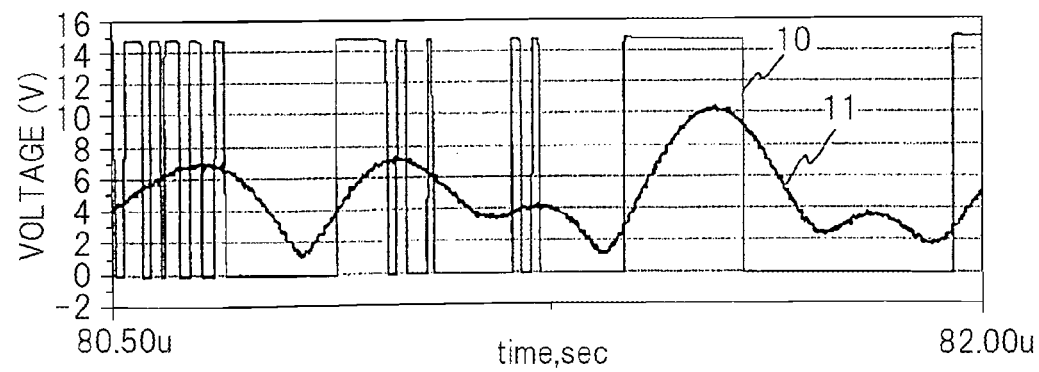
FIG. 5c A diagram showing the other operating waveform of the power supply device shown in FIG. 1.
Figure 11:
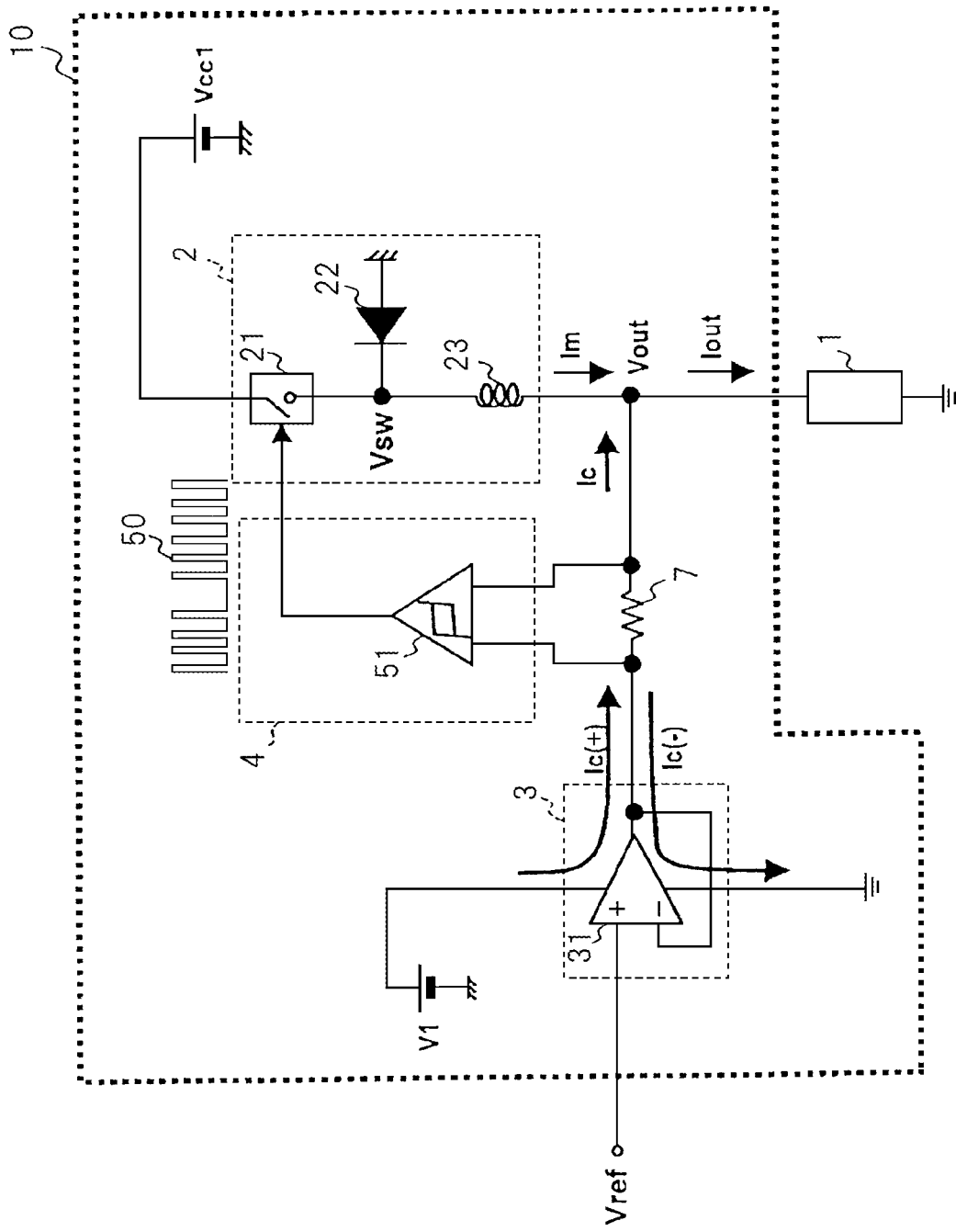
FIG. 11 A block diagram showing an example of the circuit configuration of the power supply device shown in FIG. 1.

FIG. 11 is a block diagram showing an example of the circuit configuration of the power supply device shown in FIG. 1.

First power supply modulator 41 as the power supply of the positive side of operational amplifier 31 shown in FIG. 10 and second power supply modulator 42 as the power supply of the negative side of operational amplifier 31 can include, for example, circuits (including switching amplification unit 2, linear amplification unit 3, and control signal generation unit 4) within the frame of broken line 10 in the drawing in the circuit configuration of the power supply device (power supply modulator) according to the related technology shown in FIG. 11. However, the present invention is not limited to this configuration (refer to FIGS. 14 and 15 described below).

Figure 12A:
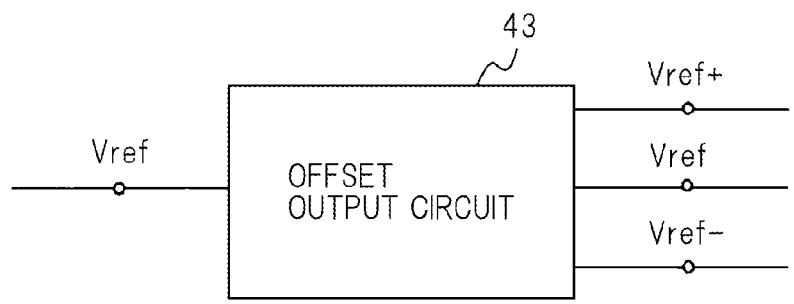
FIG. 12a A diagram showing the input-output relationship of an offset output circuit shown in FIG. 10.
Figure 12B:
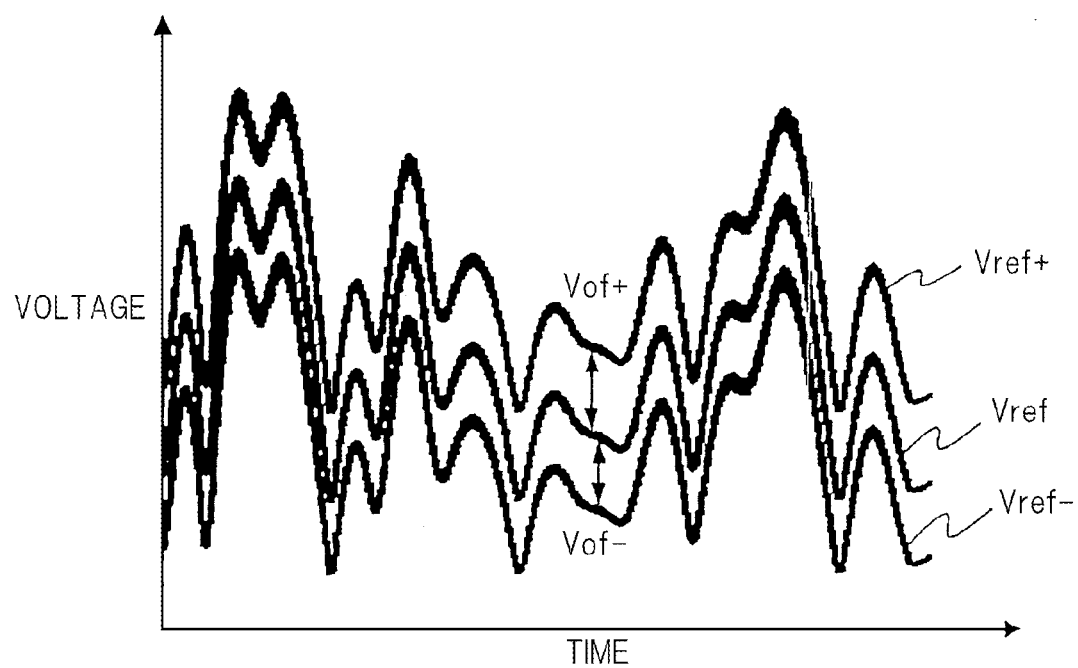
FIG. 12b A diagram showing the operating waveform of the offset output circuit shown in FIG. 10.

FIG. 12a shows the input-output relationship of the offset output circuit shown in FIG. 10, and FIG. 12b shows the operating waveform of the offset output circuit shown in FIG. 10.

Offset output circuit 43 generates and outputs, as reference signals Vref+ and Vref− of first and second power supply modulators 41 and 42, signals that are obtained by multiplying input signal Vref by offsets Vof+ and Vof− (refer to FIGS. 12A and 12B). An operation of higher efficiency is enabled because offsets Vof+ and Vof− are closer to 0. However, to maintain the linearity of the input-output signal of operational amplifier 31, offset values must be set large so that the transistor of the final stage of operational amplifier 31 can always operate in a nonlinear region.

In the power supply device of the related technology where normal switching amplifier 2 (current source) and linear amplifier 3 (voltage source) shown in FIG. 11 are configured to form a hybrid, the positive power supply side where first power supply modulator 41 shown in FIG. 10 is disposed is fixed at a certain value (Vdd) that is larger than output amplitude to be output (V1=Vdd), and the negative power supply side where second power supply modulator 42 is disposed is connected to the ground ((V2=0).

Accordingly, power loss when operational amplifier 31 supplies current Ic (+) to load 1 is (Vdd−Vc)×Ic (+) in the case of the related technology. On the other hand, power loss in the embodiment is (V1−Vc)×Ic (+), always smaller than that in the case of the related technology. This is because in the embodiment, the relationship is controlled to Vdd>V1 by first power supply modulator 41.

On the other hand, power loss when current Ic (−) flows into operational amplifier 31 is Vc×Ic (−) in the case of the related technology. On the other hand, power loss in the embodiment is (Vc−V2)×Ic (−), and is always smaller than that in the case of the related technology. This is because in the embodiment, the relationship is controlled to V2>0 by second power supply modulator 42.

Figure 13:
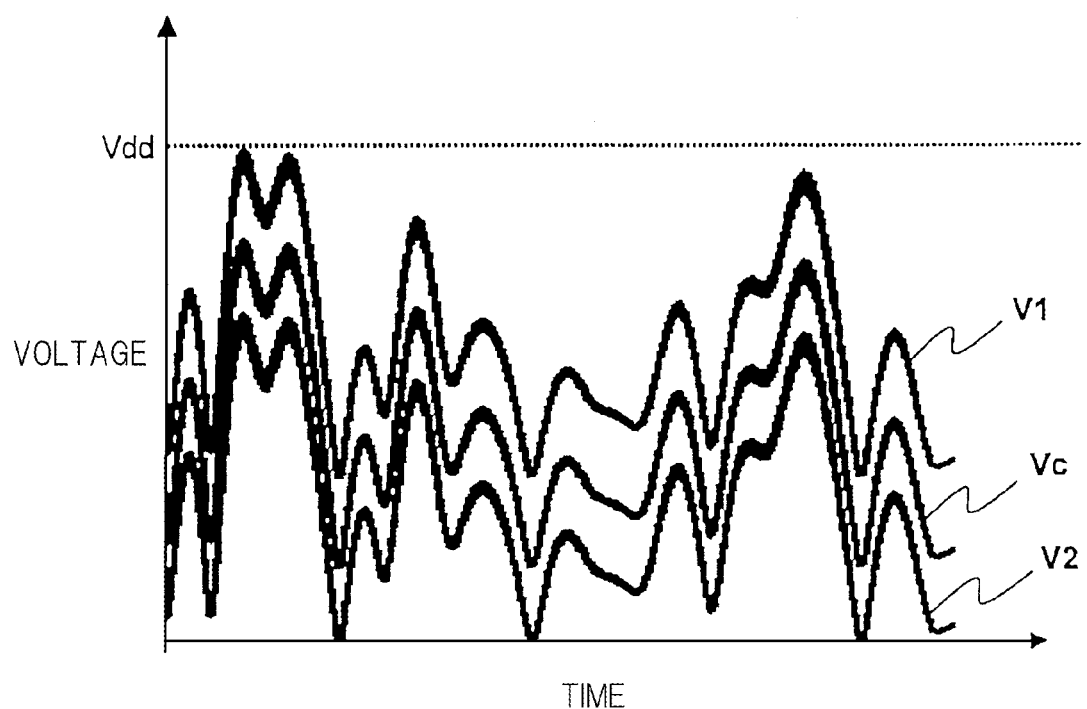
FIG. 13 A diagram showing the operating waveform of a linear amplification unit shown in FIG. 10.

FIG. 13 shows the operating waveform of the linear amplification unit shown in FIG. 10, a relationship among voltages V1, V2, Vc, and Vdd.

Thus, according to the embodiment, high efficiency can be achieved for the entire system.

In the embodiment, since a large amount of power is used, as shown in FIG. 7, operational amplifier 31 can be configured as a hybrid including small power/wide band operational amplifier 311, buffer amplifiers 312 and 313, and output stage source follower push-pull amplifiers 314 and 315.

The configuration of switching amplification unit 2, linear amplification unit 3, and control signal generation unit 4 is not limited to the circuit configuration shown in FIG. 10.

Figure 14:
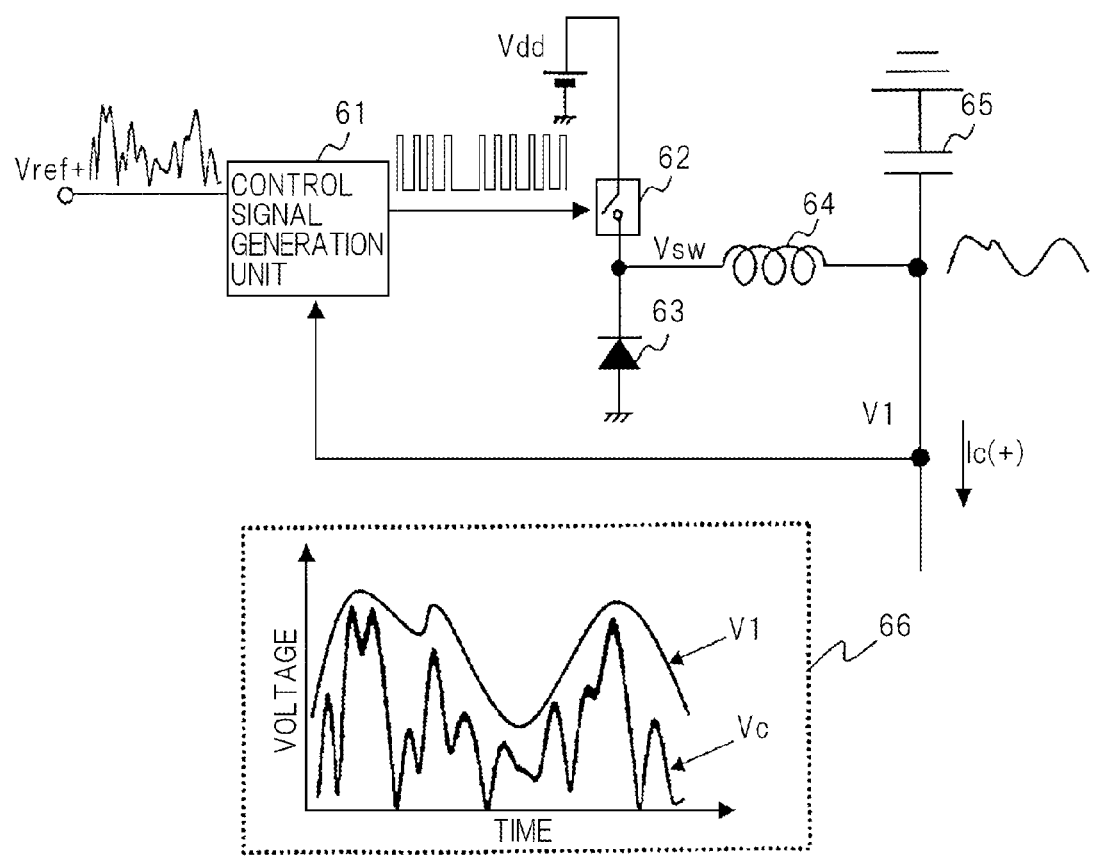
FIG. 14 A diagram showing an example of the structure of a first power supply modulator shown in FIG. 10.

FIG. 14 shows an example of the structure of first power supply modulator 41 shown in FIG. 10.

The first power supply modulator shown in FIG. 14 includes control signal generation unit 61, switching element 62, diode 63, inductor 64, and capacitor 65.

Hereinafter, the operation of first power supply modulator 41 shown in FIG. 14 will be described in detail.

Control signal generation unit 61 generates a pulse by using reference signal Vref+ and voltage feedback at V1. According to the pulse, ON/OFF of switching element 62 is controlled. Accordingly, a pulse of amplitude Vdd is generated at Vsw. The pulse is passed through inductor 64 and capacitor 65. As a result, voltage V1 is finally obtained. Voltage V1 works as the positive power supply of operational amplifier 31.

In this case, to prevent distortion of the output waveform of operational amplifier 31 shown in FIG. 10, control signal generation unit 61 performs pulse generation so that V1 can always be larger than output waveform Vc of the operational amplifier (refer to waveform 66 shown in FIG. 14).

In the example shown in FIG. 14, in addition to the highly efficient operation of switching element 62, no loss occurs at inductor 64 or capacitor 65. Thus, the configuration shown in FIG. 14 can realize highly efficient first power supply modulator 41. In terms of the entire power supply device including first power supply modulator 41 shown in FIG. 10, it is obvious from an argument similar to the description made with reference to FIG. 10 that power losses are smaller than those in the power supply device of the related technology, and the device operates highly efficiently.

Figure 15:
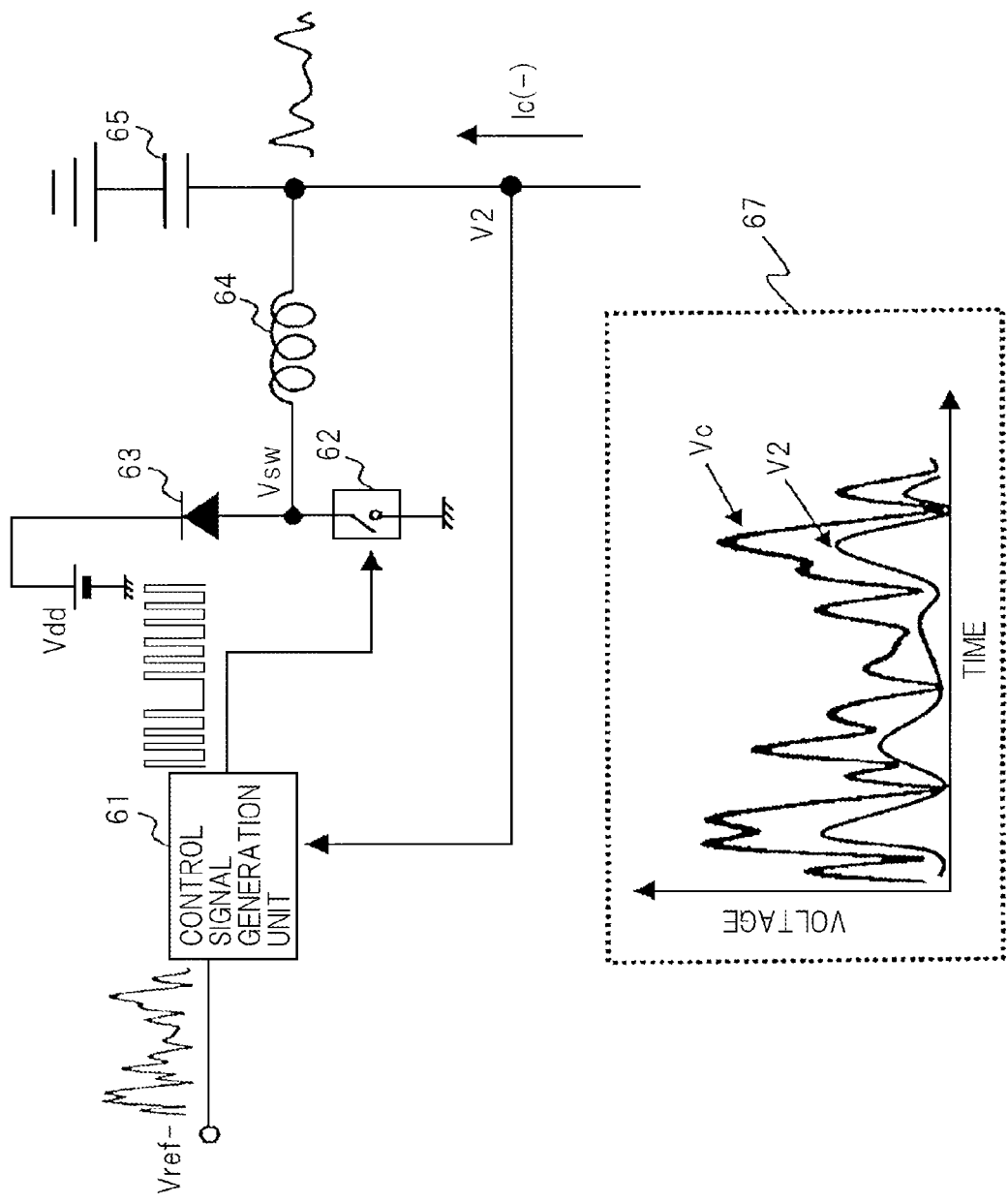
FIG. 15 A diagram showing an example of the structure of a second power supply modulator shown in FIG. 10.

FIG. 15 shows an example of the structure of second power supply modulator 42 shown in FIG. 10.

The second power supply modulator shown in FIG. 15 includes control signal generation unit 61, switching element 62, diode 63, inductor 64, and capacitor 65 similar to those shown in FIG. 14. The operation of second power supply modulator 42 shown in FIG. 15 is similar to that of first power supply modulator 41 shown in FIG. 14, and thus description thereof will be omitted. The difference of the example shown in FIG. 15 from the example shown in FIG. 14 is that to prevent distortion of output waveform Vc of operational amplifier 31 shown in FIG. 10, control signal generation unit 61 performs pulse generation so that V2 can always be smaller than output waveform Vc of the operational amplifier (refer to waveform 67 shown in FIG. 15).

In terms of the entire power supply device including second power supply modulator 42 shown in FIG. 10, it is obvious from an argument similar to the description made with reference to FIG. 14 and from an argument similar to the description made with reference to FIG. 10 that power losses are smaller than those in the power supply device of the related technology, and that the device operates highly efficiently.

The configuration of the switching amplifier by switching element 62 and diode 63 in the examples shown in FIGS. 14 and 15 can be achieved by the configuration of the other switching amplifier.

EXAMPLE 2

Figure 16:
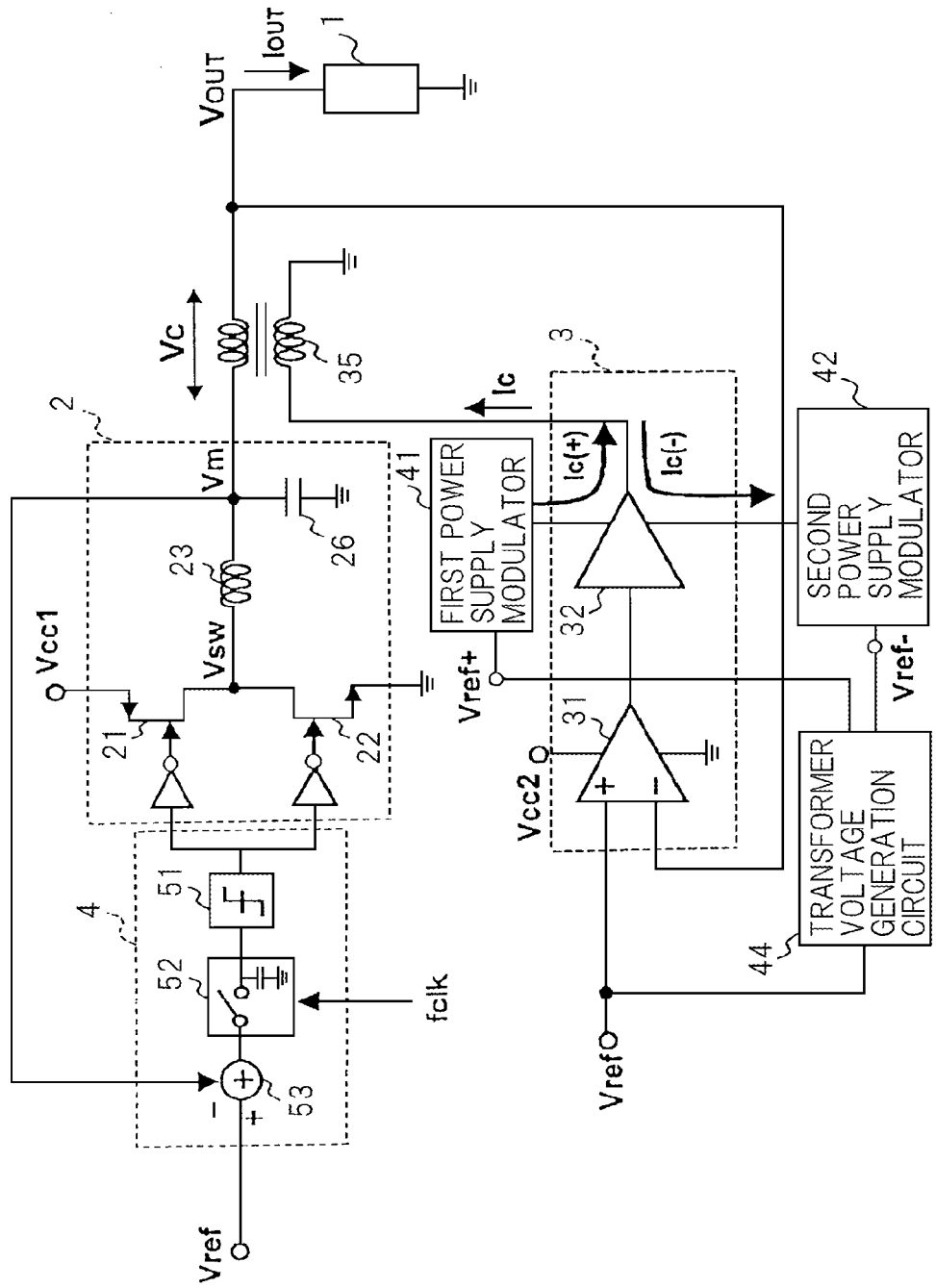
FIG. 16 A diagram showing a more specific Second Example of each block of the power supply device shown in FIG. 8.

FIG. 16 shows the more specific Second Example of each block of the power supply device shown in FIG. 8.

The power supply device shown in FIG. 16 includes, as in the case of that shown in FIG. 8, the constituting blocks of load 1, switching amplification unit 2, linear amplification unit 3, control signal generation unit 4, and first and second power supply modulators (power control units) 41 and 42.

Control signal generation unit 4 generates a pulse modulation signal of two values, i.e., High and Low, according to reference signal Vref to the power supply device and output voltage Vm of switching amplification unit 2, and outputs it as a control signal to switching amplification unit 2. Switching amplification unit 2 operates ON or OFF switching elements 21 and 22 based on the control signal from control signal generation unit 4, and outputs, as output voltage Vsw, voltage Vm smoothed by a low-pass filter including inductor 23 and capacity 26. Linear amplification unit 3 compares voltage Vout applied to load 1 with reference voltage Vref to output difference voltage Vc. Difference voltage Vc is added to voltage Vm of switching amplification unit 2 by transformer 35 to be supplied to load 1. At this time, power supply voltages V1 and V2 of linear amplification unit 3 are respectively modulated by first and second power supply modulators 41 and 42. This voltage modulation is carried out based on reference signal Vref.

More specifically, the power supply device shown in FIG. 16 includes operational amplifier 31 and buffer amplifier 32 that constitute linear amplification unit 3, comparator 51 that constitutes control signal generation unit 4, subtracter 53, sample and hold circuit 52, p-type MOSFET 21 and n-type MOSFET 22 that constitute switching elements of switching amplification unit 2, inductor 23, capacity 26, first and second power supply modulators 41 and 42 that constitute the power control unit, and transformer voltage generation circuit 44.

Next, the operation of the embodiment will be described in detail referring to FIG. 16.

As shown in FIG. 16, input signal Vref is input to subtracter 53 by control signal generation unit 4, and a difference from output Vm of switching amplification unit 2 is output. The difference signal is discretized with clock frequency fclk by sample and hold circuit 52.

The discretized difference signal is determined to be positive or negative by comparator 51, and output, as a control signal set to High when positive and Low when negative, to switching amplification unit 2.

The control signal thus obtained is a delta modulation signal where the ratio of High is higher when input signal Vref increases and the ratio of Low is higher when input signal Vref decreases.

Switching amplification unit 2 is configured to be an inverter including p-type MOSFET 21 and n-type MOSFET 22, and reverses the control signal from control signal generation unit 4 to input it.

When the control signal is High, p-type MOSFET 21 is turned ON (conductive state) while n-type MOSFET 22 is turned OFF (nonconductive state), current from Vcc 1 flows in, and the current is output toward load 1 via inductor 23.

At this time, output voltage Vsw is set to Vcc 1. On the other hand, when the control signal is Low, p-type MOSFET 21 is turned OFF (nonconductive state) while n-type MOSFET 22 is turned ON (conductive state). To maintain current flowing through inductor 23, current flows from the ground, and the current is output toward load 1. At this time, output voltage Vsw is set to 0.

Pulse output voltage Vsw thus obtained is smoothed by a low-pass filter including inductor 23 and capacity 26 to output voltage Vm.

In this operation, ideally, since power is not consumed, switching amplification unit 2 can supply voltage Vm to the load with high power efficiency.

Output voltage Vm of switching amplification unit 2 obtained by the aforementioned operation is roughly equal to input signal Vref when clock frequency fclk of sample and hold circuit 52 is sufficiently high.

When clock frequency fclk is excessively high, the switching speed of switching amplification unit 2 is high, consequently enlarging a power loss caused by the parasitic capacity of MOSFETs 21 and 22. In other words, to maintain high power efficiency, clock frequency fclk cannot be set so high. Thus, output voltage Vm, where a switching noise remains, does not match input signal Vref.

Linear amplification unit 3 inputs input signal Vref to operational amplifier 31 that constitutes a feedback amplifier, and feeds back voltage Vout applied to load 1 to output difference voltage Vc. By inputting difference voltage Vc to buffer amplifier 32, difference voltage Vc that corresponds to large current is output. Difference voltage Vc is input to the primary side coil of transformer 35 having its secondary side coil connected to the output of switching amplification unit 2.

At this time, linear amplification unit 3 amplifies only an AC component to prevent DC current from flowing to transformer 35. When the numbers of winding times of the primary side and the secondary side of transformer 35 are 1:1, output voltage Vm of switching amplification unit 2 and difference voltage Vc are added together to be output as Vout to load 1. Output voltage Vout of the power supply device thus obtained matches (or is linearly scaled with) input signal Vref with high accuracy.

When voltage Vm from switching amplification unit 2 is low (Vm<Vout), in operational amplifier 31, current Ic=Ic (+) supplied from first power supply modulator 41 controlled by Vref+ flows out to generate voltage of Vc=Vout−Vm (>0) on the primary side of transformer 35. This voltage is transmitted to the secondary side of transformer 35, and added to Vm to generate desired output voltage Vout. A power loss generated in operational amplifier 31 in this case is (V1−Vc)×Ic (+).

On the other hand, when voltage Vm from switching amplification unit 2 is high with respect to voltage Vout applied to load 1 (Vm>Vout), current Ic=Ic (−) flows into second power supply modulator 42 controlled by Vref− via operational amplifier 31 to generate a power loss of Vc=Vout−Vm (<0) on the primary side of transformer 35. This power loss is transmitted to the secondary side of transformer 35, and added to Vm to generate desired output voltage Vout. In this case, a power loss generated in operational amplifier 31 is (Vc−V2)×Ic (−).

Transformer voltage generation circuit 44 generates reference signals Vref+ and Vref− of first and second power supply modulators 41 and 42 from input signal Vref. Specifically, transformer voltage generation circuit 44 is a circuit for predicting the values of Vsw, Vm, and Vc from reference signal Vref by an arithmetic circuit such as DSP (Digital Signal Processor), and then respectively outputting voltage Vref+ multiplied with positive offset and voltage Vref− multiplied with negative offset to first and second power supply modulators 41 and 42. To maintain the linearity of reference signal Vref of operational amplifier 31 and output signal Vc of buffer amplifier 32, the respective offset values must be set large enough to normally operate buffer amplifier 32.

In the configuration of the related technology, the positive power supply side where first power supply modulator 41 shown in FIG. 16 is disposed is fixed at a certain value (Vdd) that is larger than the output amplitude to be output (V1=Vdd), and the negative power supply side where second power supply modulator 42 is disposed is connected to the ground ((V2=0).

Accordingly, a power loss when operational amplifier 31 supplies current Ic (+) to load 1 is (Vdd−Vc)×Ic (+) in the case of the related technology. On the other hand, in the embodiment, a power loss in buffer amplifier 32 that is (V1−Vc)×Ic (+), is always smaller than that in the case of the related technology. This is because in the embodiment, the relationship is controlled to Vdd>V1 by first power supply modulator 41.

On the other hand, a power loss when current Ic (−) flows into operational amplifier 31 is Vc×Ic (−) in the case of the related technology. On the other hand, a power loss in buffer amplifier 32 of the embodiment that is (Vc−V2)×Ic (−), is always smaller than that in the case of the related technology. This is because in the embodiment, the relationship is controlled to V2>0 by second power supply modulator 42.

Thus, according to the embodiment, high efficiency can be achieved for the entire system.

In the embodiment, since a large amount of power is used, as shown in FIG. 9, operational amplifier 31 and buffer amplifier 32 can be configured as a hybrid including small power/wide band operational amplifier 311, buffer amplifiers 312 and 313, output stage source follower push-pull amplifiers 314 and 315, and capacity 316.

In FIG. 16, control signal generation unit 4 is an example of delta modulation. However, it can be pulse width modulation or delta sigma modulation.

The configuration of switching amplification unit 2 and linear amplification unit 3 is not limited to the circuit configuration shown in FIG. 16.

Some or all parts of the embodiments can be described in the following appendixes. However, the appendixes are in no way limitative of the present invention.

(Appendix 1)

A power supply device characterized by including a switching amplification unit that supplies power to a load, a linear amplification unit that corrects an output voltage applied to the load according to an input signal, and a power supply control unit that controls the power supply of the linear amplification unit according to the input signal.

(Appendix 2)

The power supply device according to appendix 1, characterized in that the power supply control unit includes a first power supply modulator that subjects a power supply of a positive side of the linear amplification unit to voltage modulation according to the input signal, and a second power supply modulator that subjects a power supply of a negative side of the linear amplification unit to voltage modulation according to the input signal.

(Appendix 3)

The power supply device according to appendix 2, further including a current detection unit that detects a flowing direction and a size of output current of the linear amplification unit, and a control signal generation unit that generates a control signal of the switching amplification unit based on a detection result of the current detection unit, characterized in that the linear amplification unit and the switching amplification unit are connected to the load in parallel, the switching amplification unit outputs current subjected to switching amplification based on the control signal, the linear amplification unit subjects the input signal and the output voltage to feedback amplification to set a linear relationship, and then outputs the input signal and the output voltage, the output current of the linear amplification unit and output current of the switching amplification unit are added together to be output to the load, and the output current of the linear amplification unit is supplied from the first power supply modulator when a value is positive, and is supplied to the second power supply modulator when the value is negative.

(Appendix 4)

The power supply device according to appendix 2, further including a control signal generation unit that generates a control signal of the switching amplification unit based on the input signal, characterized in that the linear amplification unit and the switching amplification unit are connected to the load in series, the switching amplification unit outputs a voltage subjected to switching amplification based on the control signal, the linear amplification unit subjects the input signal and the output voltage to feedback amplification to set a linear relationship, and then outputs the input signal and the output voltage, the output voltage of the linear amplification unit and output voltage of the switching amplification unit are added together to be output to the load, and the output current of the linear amplification unit is supplied from the first power supply modulator when a value is positive, and is supplied to the second power supply modulator when the value is negative.

(Appendix 5)

The power supply device according to any one of appendixes 2 to 4, characterized in that the power supply control unit further includes a circuit that generates a signal by applying positive offset to the input signal to supply the signal to the first power supply modulator, and generates a signal by applying a negative offset to the input signal to supply the signal to the second power supply modulator.

(Appendix 6)

The power supply device according to appendix 3, characterized in that the control signal generation unit includes at least one hysteresis comparator, and the hysteresis comparator outputs a determination result based on a signal detecting the flowing direction and the size of the output current of the linear amplification unit.

(Appendix 7)

The power supply device according to appendix 3, characterized in that the current detection unit detects the flowing direction and the size of the output current of the linear amplification unit by detecting a potential drop caused by a resistor disposed in series in an output path of the linear amplification unit.

(Appendix 8)

The power supply device according to appendix 4, characterized in that the control signal generation unit generates a control signal based on delta modulation, or pulse width modulation, or delta sigma modulation.

(Appendix 9)

The power supply device according to any one of appendixes 1 to 8, characterized in that the linear amplification unit is a voltage follower or a negative feedback amplifier, and obtains a feedback signal from the output terminal.

(Appendix 10)

A transmission device characterized by including the power supply device according to any one of appendixes 1 to 9, and a power amplifier that uses the power supply device as a power source.

(Appendix 11)

A method for operating a power supply device characterized by including supplying power to a load by a switching amplification unit, correcting an output voltage applied to the load by a linear amplification unit according to an input signal, and controlling the power supply of the linear amplification unit by a power supply control unit according to the input signal.

(Appendix 12)

The method for operating the power supply device according to appendix 11, characterized in that the power supply control unit includes a first power supply modulator that subjects a power supply of a positive side of the linear amplification unit to voltage modulation according to the input signal, and a second power supply modulator that subjects a power supply of a negative side of the linear amplification unit to voltage modulation according to the input signal.

(Appendix 13)

The method for operating the power supply device according to appendix 12, characterized in that the linear amplification unit and the switching amplification unit are connected to the load in parallel, a current detection unit detects a flowing direction and a size of output current of the linear amplification unit, a control signal generation unit generates a control signal of the switching amplification unit based on a detection result of the current detection unit, the switching amplification unit outputs current subjected to switching amplification based on the control signal, the linear amplification unit subjects the input signal and the output voltage to feedback amplification to set a linear relationship, and then outputs the input signal and the output voltage, the output current of the linear amplification unit and output current of the switching amplification unit are added together to be output to the load, and the output current of the linear amplification unit is supplied from the first power supply modulator when a value is positive, and supplied to the second power supply modulator when the value is negative.

(Appendix 14)

The method for operating the power supply device according to appendix 12, characterized in that the linear amplification unit and the switching amplification unit are connected to the load in series, a control signal generation unit generates a control signal of the switching amplification unit based on the input signal, the switching amplification unit outputs a voltage subjected to switching amplification based on the control signal, the linear amplification unit subjects the input signal and the output voltage to feedback amplification to set a linear relationship, and then outputs the input signal and the output voltage, the output voltage of the linear amplification unit and output voltage of the switching amplification unit are added together to be output to the load, and the output current of the linear amplification unit is supplied from the first power supply modulator when a value is positive, and is supplied to the second power supply modulator when the value is negative.

(Appendix 15)

The method for operating the power supply device according to any one of appendixes 12 to 14, characterized in that the power supply control unit further includes a circuit that generates a signal by applying a positive offset to the input signal to supply the signal to the first power supply modulator, and generates a signal by applying a negative offset to the input signal to supply the signal to the second power supply modulator.

Appendix 16)

The method for operating the power supply device according to appendix 13, characterized in that the control signal generation unit includes at least one hysteresis comparator, and the hysteresis comparator outputs a determination result based on a signal detecting the flowing direction and the size of the output current of the linear amplification unit.

Appendix 17)

The method for operating the power supply device according to appendix 13, characterized in that the current detection unit detects the flowing direction and the size of the output current of the linear amplification unit by detecting a potential drop caused by a resistor disposed in series in an output path of the linear amplification unit.

(Appendix 18)

The method for operating the power supply device according to appendix 14, characterized in that the control signal generation unit generates a control signal based on delta modulation, or pulse width modulation, or delta sigma modulation.

(Appendix 19)

The method for operating the power supply device according to any one of appendixes 11 to 18, characterized in that the linear amplification unit is a voltage follower or a negative feedback amplifier, and obtains a feedback signal from the output terminal.

The embodiments of the present invention have been described. However, the present invention is not limited to the embodiments. Various changes understandable to those skilled in by the art can be made to the configuration and the specifics of the present invention within the scope of the invention.

This application claims priority from Japanese Patent Application No. 2011-108176 filed May 13, 2011, which is hereby incorporated by reference herein in its entirety.

INDUSTRIAL APPLICABILITY

As described above, the present invention is applicable to a transmission device mainly used for wireless communication. In particular, the present invention is applicable to a power supply device having the function of changing the output voltage according to the size of the input signal, and a transmission device that includes a power amplifier using the same. The application examples of the present invention are a mobile phone, a wireless LAN, a terminal for WiMAX (Worldwide Interoperability for Microwave Access), and a transmission device used for a base station or a digital terrestrial broadcasting station.

The invention claimed is:

1. A power supply device comprising:
a switching amplification unit that supplies power to a load;
a linear amplification unit that corrects an output voltage applied to the load according to an input signal;
a power supply control unit that controls the power supply of the linear amplification unit according to the input signal, wherein the power supply control unit includes:
a first power supply modulator that subjects a power supply of a positive side of the linear amplification unit to voltage modulation according to the input signal; and
a second power supply modulator that subjects a power supply of a negative side of the linear amplification unit to voltage modulation according to the input signal; and
a control signal generation unit that generates a control signal of the switching amplification unit based on the input signal,
wherein:
the linear amplification unit and the switching amplification unit are connected to the load in series;
the switching amplification unit outputs a voltage subjected to switching amplification based on the control signal;
the linear amplification unit subjects the input signal and the output voltage to feedback amplification to set a linear relationship, and then outputs the input signal and the output voltage;
the output voltage of the linear amplification unit and output voltage of the switching amplification unit are added together to be output to the load; and
the output current of the linear amplification unit is supplied from the first power supply modulator when a value is positive, and is supplied to the second power supply modulator when the value is negative.

2. The power supply device according to claim 1, wherein the power supply control unit further includes a circuit that generates a signal by applying positive offset to the input signal to supply the signal to the first power supply modulator, and generates a signal by applying negative offset to the input signal to supply the signal to the second power supply modulator.

3. The power supply device according to claim 1, wherein the control signal generation unit generates a control signal based on delta modulation, or pulse width modulation, or delta sigma modulation.

4. A transmission device comprising:
the power supply device according to claim 1; and
a power amplifier that uses the power supply device as a power source.

* * * * *